US008598840B2

(12) United States Patent
Yount et al.

(10) Patent No.: US 8,598,840 B2
(45) Date of Patent: Dec. 3, 2013

(54) FAULT-TOLERANT BATTERY MANAGEMENT SYSTEM, CIRCUITS AND METHODS

(75) Inventors: Larry James Yount, Scottsdale, AZ (US); Willard Ahart Blevins, Glendale, AZ (US); Inder Jit Verma, Phoenix, AZ (US)

(73) Assignee: LaunchPoint Energy and Power LLC, Scottsdale, AZ (US)

( * ) Notice: Subject to any disclaimer, the term of this patent is extended or adjusted under 35 U.S.C. 154(b) by 393 days.

(21) Appl. No.: 13/086,927

(22) Filed: Apr. 14, 2011

(65) Prior Publication Data

US 2011/0254502 A1 Oct. 20, 2011

Related U.S. Application Data

(60) Provisional application No. 61/324,663, filed on Apr. 15, 2010.

(51) Int. Cl.
*H02J 7/00* (2006.01)

(52) U.S. Cl.
USPC .................. 320/107; 320/134; 320/136

(58) Field of Classification Search
USPC ............................................. 320/107
See application file for complete search history.

(56) References Cited

U.S. PATENT DOCUMENTS

| 5,656,915 | A | * | 8/1997 | Eaves ............................. 320/118 |
| 5,892,973 | A | | 4/1999 | Martinez et al. |
| 6,037,750 | A | * | 3/2000 | Von Novak .................... 320/132 |
| 6,134,505 | A | | 10/2000 | Smith |
| 7,613,974 | B2 | | 11/2009 | Meagher |
| 7,615,966 | B2 | * | 11/2009 | Houldsworth et al. ....... 320/132 |
| 7,880,434 | B2 | * | 2/2011 | White et al. ................... 320/119 |
| 2006/0064211 | A1 | | 3/2006 | Johansen et al. |
| 2006/0103348 | A1 | * | 5/2006 | Melichar ........................ 320/116 |
| 2009/0009143 | A1 | | 1/2009 | Odaohhara |
| 2009/0198399 | A1 | | 8/2009 | Kubo et al. |

(Continued)

FOREIGN PATENT DOCUMENTS

WO WO2009103086 8/2009

OTHER PUBLICATIONS

Berdichevsky,Gene; Kelty, Kurt; Straubel, JB; Toomre, Erik; "The Tesla Roadster Battery System"; journal article; Aug. 16, 2006; 5 pages; Tesla Motors.

(Continued)

*Primary Examiner* — Arun Williams
(74) *Attorney, Agent, or Firm* — George P. White

(57) ABSTRACT

A fault tolerant battery management system includes redundancy, with applications including electric vehicles. Portions of its circuitry are constituted in distinct fault domains with control, monitoring, and balancing of cells circuitry fault-effect-isolated from the circuitry associated with built-in real-time testing. Built-in tests are orchestrated in fault domains isolated from the functional circuitry being verified. These built-in tests provide test stimulus unique for each cell measurement. Cell balancing is performed in a fault tolerant manner. It takes at least two independent faults, in two mutually distinct fault domains, to negatively affect balancing capability or to interfere with a redundant circuit's ability to operate. The built-in tests allow operation without the requirement for data cross-compare between redundant measuring electronic elements. Testing and balancing functions are interlocked through encoded enabling methodologies and transmit enables on serial buses. The circuitry is divided into mutually fault-isolated modules, each responsible for a subset of the cells.

29 Claims, 19 Drawing Sheets

(56) References Cited

U.S. PATENT DOCUMENTS

2010/0072947 A1* 3/2010 Chan et al. .................... 320/134
2010/0085009 A1* 4/2010 Kang et al. .................... 320/118
2010/0259221 A1* 10/2010 Tabatowski-Bush ......... 320/134

OTHER PUBLICATIONS

Li Siguang, Zhang Chengning, "Study on Battery Management System and Lithium-ion Battery", journal article, 2009, 5 pages, Computer and Automation Engineering, 2009. ICCAE '09. International Conference on Mar. 8-10, 2009.

Johnson A Asumadu; Mohammed Haque; Helio Vogel; Charles Willards; "Precision Battery Management System"; journal article; May 17-19, 2005; 4 pages; Technology Conference, Ottawa, Canada.

Button, Robert; Gonzalez, Marcelo; "Modular Battery Charge Controller"; article; Aug. 3, 2009; 2 pages; Tech Briefs Media Group, Anaheim, CA.

Chatzakis, John; Kalaitzakis, Kostas; Voulgaris, Nicholas C.; Manias, Stefanos N.; "Designing a New Generalized Battery Management System"; journal article; 10 pages; IEEE Transactions on Industrial Electronics, vol. 50, No. 5, Oct. 2003.

Linear Technology, "Independent Multicell Battery Stack Fault Monitor", data sheet, 28 pages, Linear Technology Corporation, Jul. 2010, Milpitas, CA.

Stanley-Marbell, Phillip; Marculescu, Diana; "Dynamic Fault-Tolerance and Metrics for Battery Powered, Failure-Prone Systems"; 8 pages; ICCAD '03 Proceedings of the 2003 IEEE/ACM international conference on Computer-aided design, IEEE Computer Society Washington, DC, USA.

Chitradeep Sen, Narayan C. Kar, "Battery Pack Modeling for the Analysis of Battery Management System of a Hybrid Electric Vehicle", journal article, Sep. 7-10, 2009, 6 pages, Vehicle Power and Propulsion Conference, 2009. VPPC '09. IEEE.

* cited by examiner

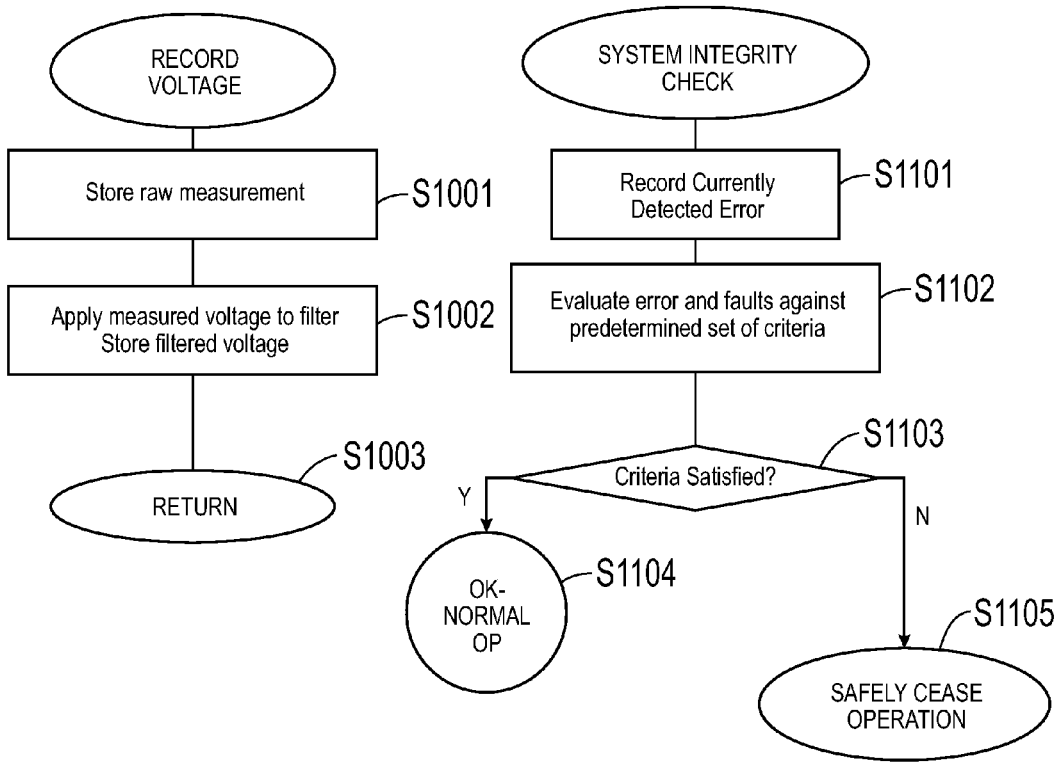

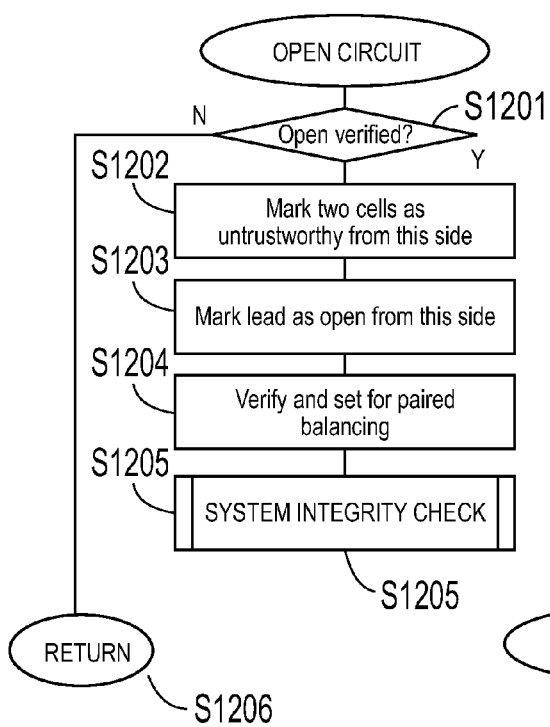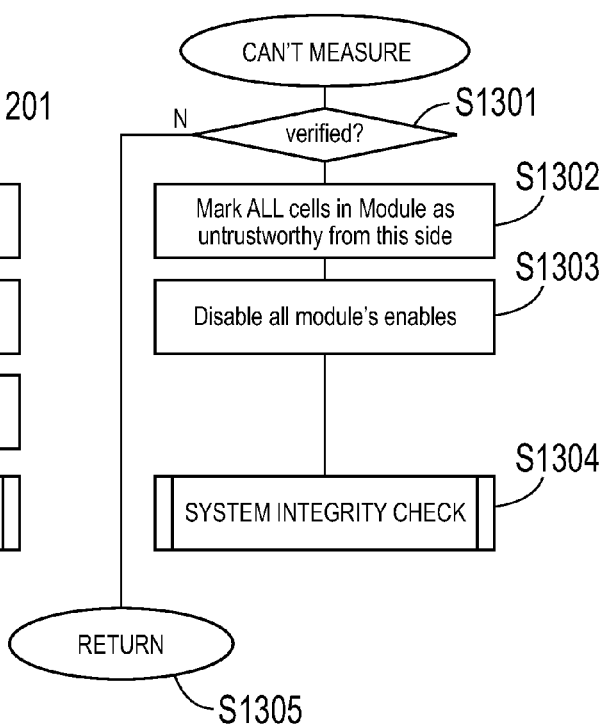
FIG. 12
FIG. 13

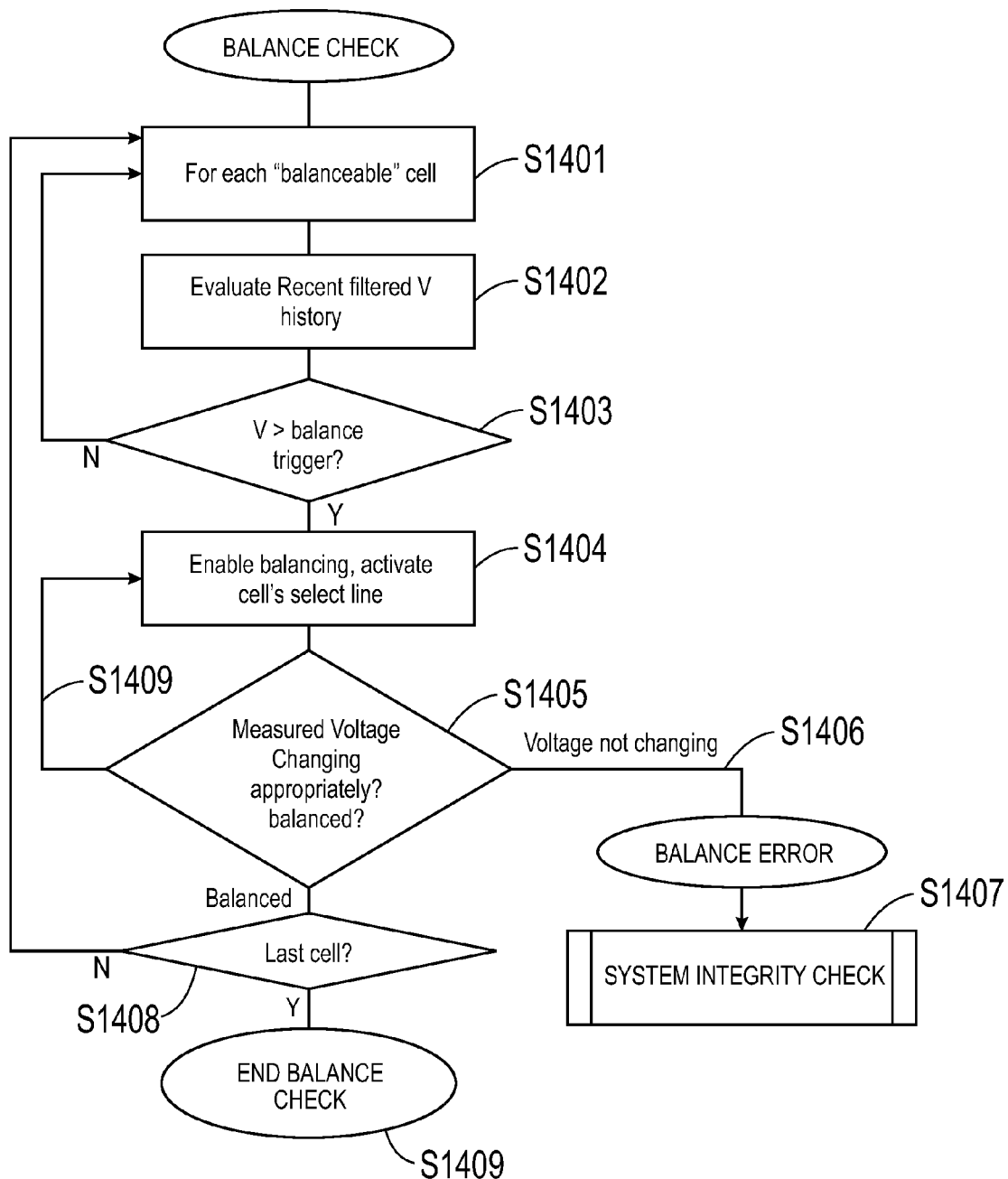

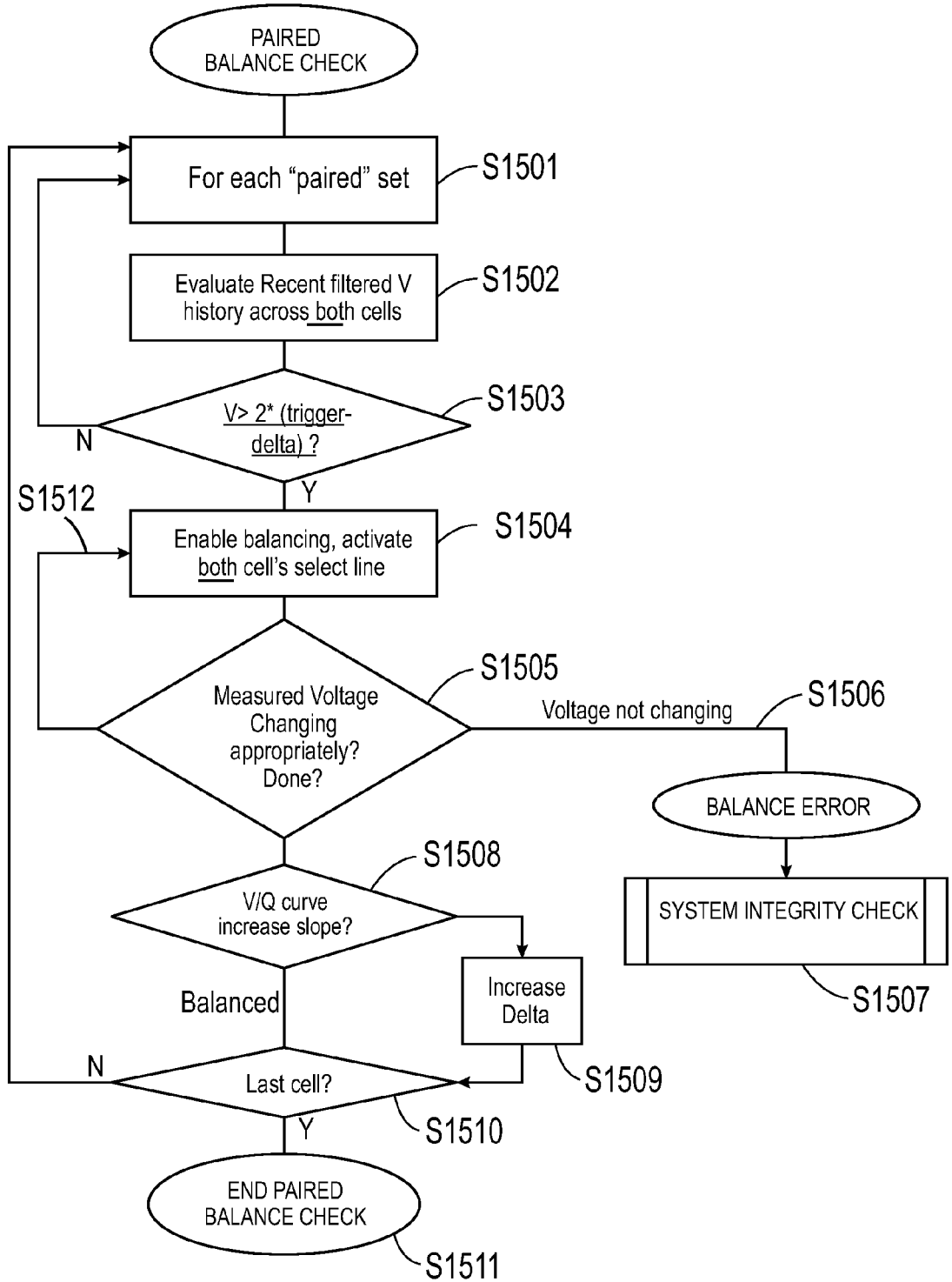

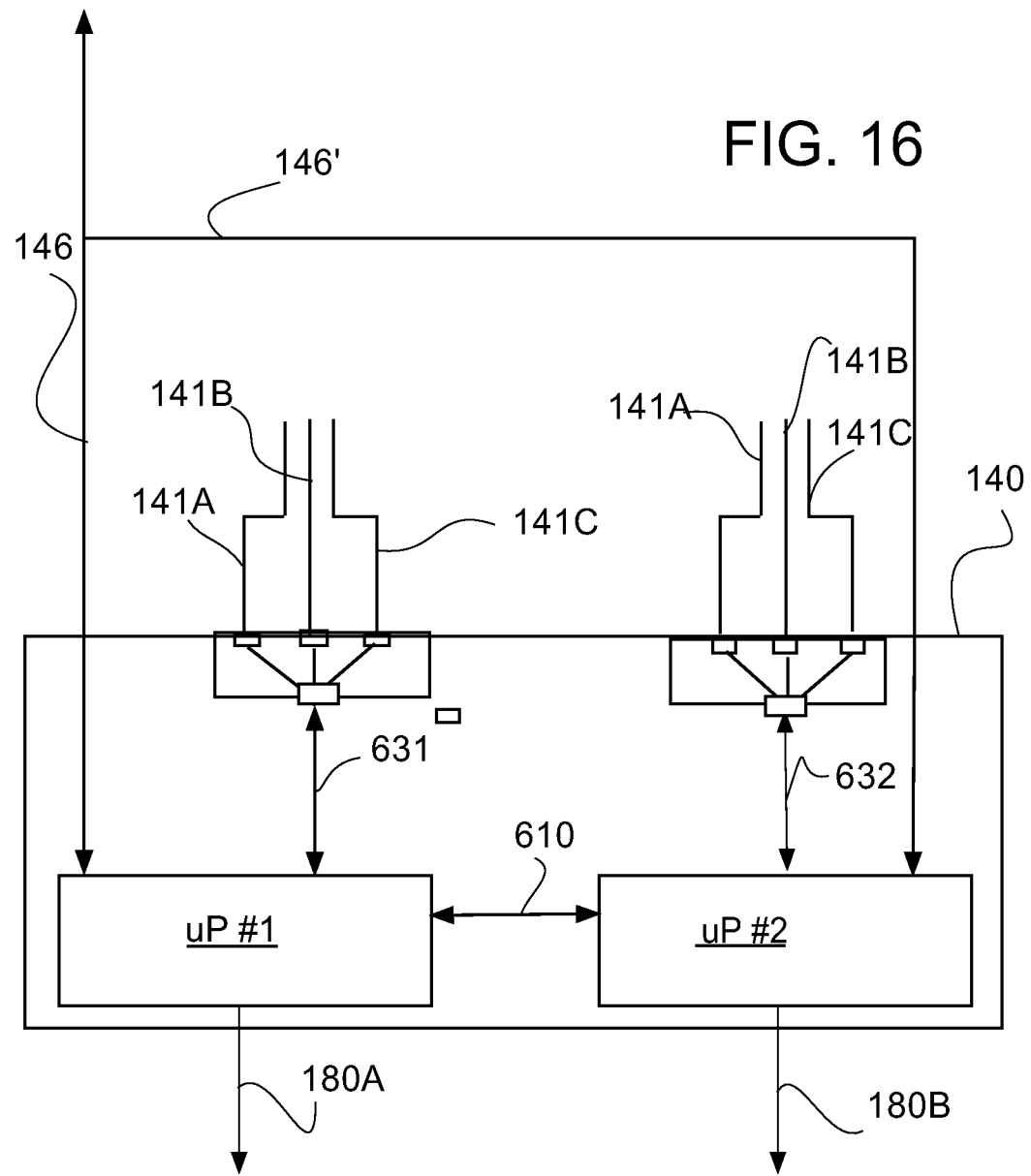

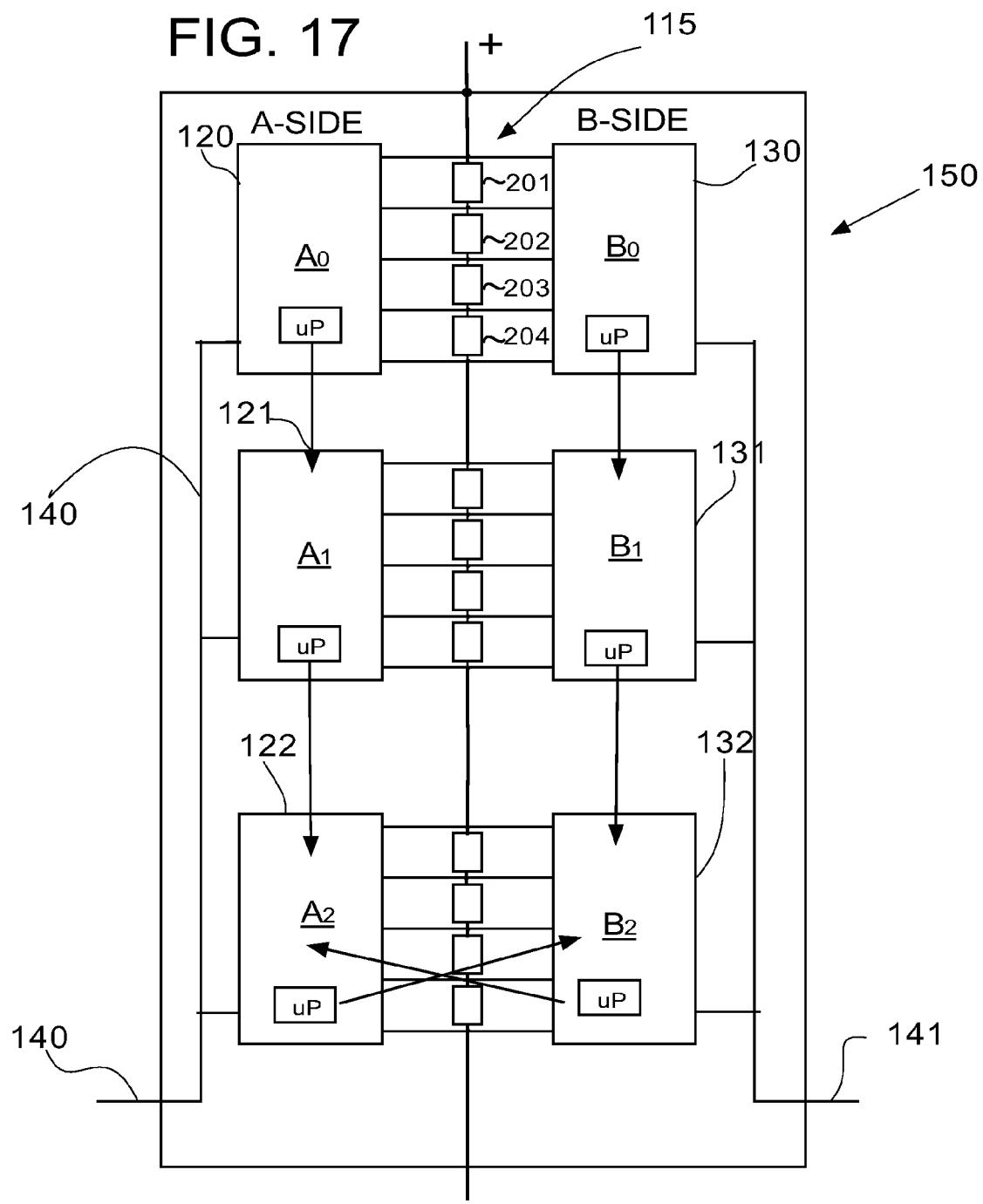

FAULT-TOLERANT BATTERY MANAGEMENT SYSTEM, CIRCUITS AND METHODS

RELATED APPLICATIONS

This application claims priority from U.S. provisional application 61/324,663 filed Apr. 15, 2010, which is hereby incorporated herein by reference in its entirety.

FIELD

The present invention relates to fault-tolerant electronic management of batteries of cells, particularly for use in large battery installations.

BACKGROUND

It is well known that certain battery cell chemistries, lithium ion for example, are susceptible to overcharging and to over-discharging operational problems. Overcharging and over-discharging issues can be in terms of the total state-of-charge or (SOC) in the rate of charge or rate of discharge. Occurrences of these conditions and other events can cause a reduced useful battery life. In the extreme, destructive mishaps involving intense heat, fire, and even explosion can occur. Avoiding such affects is particularly relevant when batteries of many cells are used with safety implications. In proximity to human activity is one example.

It is known to have electronic monitoring and control of state-of-charge and of temperature on a cell-by-cell basis. Control can affect overall charging/discharging characteristics and in many systems can reduce or increase the charge in individual cells via cell balancing.

It is also known to introduce a degree redundancy or back-up monitoring functionality in battery management systems to reduce the probability that one electronic failure will leave the battery and charging system in a state that allows, or even engenders, a significantly destructive cell mishap.

Electric vehicles (EV), Hybrid Electric Vehicles (HEV), and electric grid-stabilization are important examples of applications requiring a large number of lithium-ion cells. With cells connected in series, these batteries can have potential of over 300 volts. For safety from electrical hazard, safety from electrochemical fault effects, and to prevent tampering by untrained people, the cells are generally well contained within an enclosed "pack". A pack is a secure container with a limited, protected, set of high-voltage connections. The pack generally includes the majority of the electronics associated with the battery management system and control logic as well as the cells themselves. An EV or HEV pack is intended to only be opened and repaired at a qualified center. A pack swap-out with a refurbished pack or other pack maintenance action can cost a significant fraction of the value of a vehicle. It is therefore desirable to avoid or minimize the need for pack maintenance due to electronic failure. While a triple-redundant system might be able to provide a degree of that capability, it would do so at a cost that might be prohibitive.

A system that could cost-effectively reduce the frequency of battery pack replacement in an EV from once in a vehicles life to never in a vehicles life, for example, would make a significant reduction in the projected lifetime cost of such vehicles.

SUMMARY

The problem of a BMS that can continue full, safe operation after any single unrepaired fault and after most $2^{nd}$ and third unrepaired faults can be solved by a system with dually redundant battery monitoring and management functional circuitry arranged in independent, fault isolated modules. Each redundant module can have a built-in test circuit and logic. The respective test circuits can be constituted in one or more fault domains that are distinct from the fault domains of the tested functional circuitry. A test function can be an end-to-end test including a stimulus circuit that can be commanded to affect the condition of a monitored battery voltage. Various cell channels can be affected by an applied stimulus in mutually distinct degrees. The initiating of predetermined input altering and the analysis of the resulting measurements can be performed by logic located in a fault domain distinct from that of the tested circuitry and distinct from that of the stimulus circuitry.

STIM of Unique Values

One aspect to reliable testing of cell voltage measurements at a module level can be checks and balances against faults in the test stimulation circuitry. One class of possible faults can interfere with the proper mapping of a cell to a cell-measuring channel. To guard against this type of "crossed wires" error, the example system provides a stimulus of a unique value for each tested point. The mutually distinct values can be determined by the values of passive components.

To allow either side of a dually redundant system to provide battery management services in the face of a single point failure in the other side, functions on one side that could interfere with the opposite side's ability to take control can be enabled in a manner immune from being "stuck-on" due to any single point failure. This can be via the requirement of multiple independent enable signals originating in mutually distinct fault domains. Enable messages can be encoded and dead-man timers employed.

BRIEF DESCRIPTION OF FIGURES

FIG. 10 is a flowchart of steps to store voltage measurement;

FIG. 11 is a flowchart for checking a data structure to access the integrity of the systems and to take appropriate action;

FIG. 12 is a flowchart of the steps to be taken if an open circuit is detected;

FIG. 13 is a flowchart of the steps to be taken if a module cannot make a trustworthy voltage measurement;

FIG. 14 is a flowchart for checking a data structure to see if cell balancing is required and to perform the balancing;

FIG. 15 is a flowchart for checking a data structure to see if paired cell balancing is required and to perform the paired balancing;

FIG. 16 is an expanded view of the central controller of the system diagram of FIG. 2 with the central controller expanded and physical buses shown;

FIG. 17 is a block diagram of a second example version system.

DETAILED DESCRIPTION OF VARIOUS EMBODIMENTS

Introduction

Figure 1:
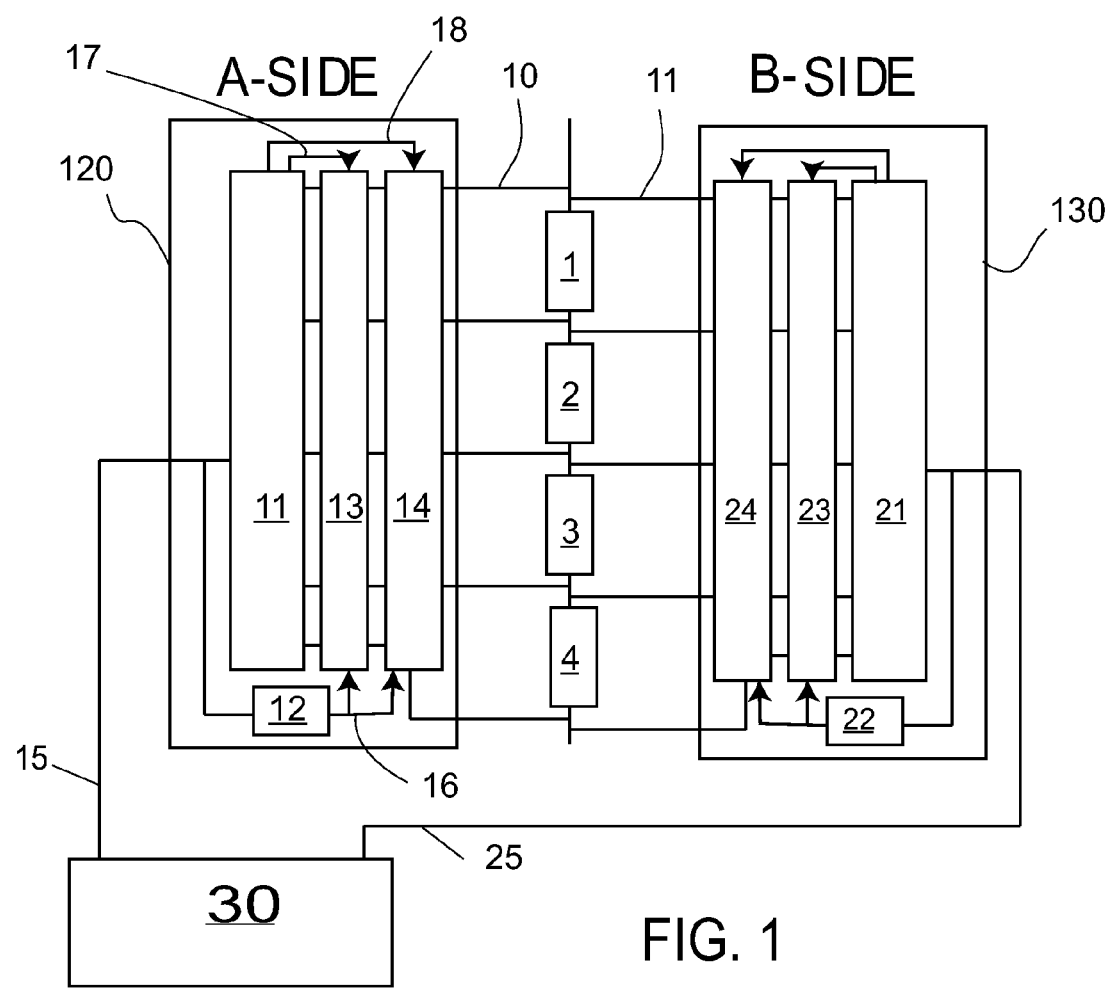
FIG. 1 is a block diagram of two modules, an A-side and a corresponding B-side.

An example system for managing a large lithium ion battery for robust safe operation can continue full operation under any first single point failure of the electronics within the battery pack. Further, it can continue to operate under the majority of possible "second fault" and even "third fault" situations. All operating states include the ability to detect an unsafe condition. Electronics outside a sealed battery pack are easier to service and repair then electronics within the battery pack so some implementation may not provided the same degree of robustness for that external circuitry.

In an example system presented, the robustness is provided for by redundant battery monitoring and control logic modules within the pack that are commanded and controlled by computational resources outside of the pack. The decision logic executing outside of the pack operates a specific type of built-in test on the redundant modules within the pack. It is not a self-test in that the internal modules do not provide a conclusionary report of their own respective health. Rather, test circuitry within the pack that is in a distinct fault domain from the functional monitoring and controlling circuitry is separately commanded and controlled by the external logic. The test circuitry is capable to inject known signals and circuit conditions to the functional circuitry. If commanding a test circuit to alter a functional circuits' input condition is not seen to produce the expected result, then either the test circuit or the functional circuit has a fault. In that case, all of the circuitry in both the functional and test circuits' fault domains is deemed untrustworthy. This provides for a system for which no single point failure can go undetected.

By distinct fault domain, it is meant that sets of circuitry are embodied independently enough from each other such that no single point failure in one set of circuitry constitutes a single point failure in the other set. To simplify a principle of the system, faults in the functional circuitry are all detectable because of the extensive and known nature of the test circuits' ability to manipulate the functional circuitries' inputs conditions. Conversely, faults in the test circuits are detectable since their test-mode effects are pre-determinedly known.

Reliable detecting of faults in the redundant functional modules is needed since this is a dual-redundant system. Again, one way to look at this system is in comparison with fault tolerant systems that often require a triple redundancy in order to continue operation in the face of a fault. In a triple redundant system there are usually three separate full systems that "vote" on their results to decide if one is out-of-step with the other two. This allows confident continued operation. In many triple redundant systems the intention is to promptly replace or repair the offending portion.

Traditionally dual systems are not considered to provide continued operation fault tolerance. If the systems disagree, who is to say which one, if either, is the one with the fault? In the present system, no voting is required and there is not need to compare the results provided by an A-side to those provided by a B-side. There is a reliable independent way to determine, respectively, whether the A-side and the B-side, independently are functioning correctly via the end-to-end tests.

A further principle of these teachings is that the A-side and the B-side subsystems are not monolithic all-or-nothing modules. The management of multiple cells lends itself to a BMS partitioned in sets of series of cells. In the example system, every four cells are shown connected to a distinct "slice" of the BMS logic, called a module. Each module is in a separate fault domain therefore a single-point fault in one A-side module, for example, does not interfere with the other A-side modules' functioning.

Some of these example systems use relatively unintelligent circuitry in the electronics located within the pack. In those systems, the redundant BMS elements within the pack can be commanded, controlled, and tested via logic in a controller external to the pack. One manner to embody a reliable external controller is by the controller consisting of software modules executing on a redundant fault tolerant computer.

First Example Embodiment Simplified Example
A- and B-Side Redundant Systems In The Pack With External Centralized Controller System Level Structure This first example embodiment includes two substantially identical redundant sets of battery monitoring and balancing circuitry. Labeled as A-side and as B-side one four-cell subsystem is shown in the block diagram of FIG. 1. Each side is connected to the cells with wires 10 20 and can independently monitor and manage all four cells. Describing the A-side sub-module 120, it has functional monitoring circuitry 101 as well at test control circuitry 12, input stimulation circuitry 13, and cell balancing circuitry 14. The A-side is commanded and controlled from a computer system 30 over a serial bus 15. The B-side is seen to have identical structures 20 21 22 23 24 to the A-side circuitry. It is commanded and controlled from the computer system 30 over a second serial bus 25.

As mentioned above, the test control circuitry and stimulation circuitry are in fault domains distinct from those of the functional circuitry. This allows any single fault in the A-side module to be detected from the vantage point of the computer system. If the A-side and B-side operated with no possible affect on one another, any fault in either side would not impede the remaining side performing all functions. However, the application of test stimulation on one side might affect the other side's function. More importantly, the continued erroneous removing or adding of charge to a cell by one side would hamper the working side of properly operating the cells. Therefore, as will be seen in more detail, stimulation and cell balancing circuitry have dual enables 16 17. The enables are driven from logic in independent fault domains and the enable control signals on the serial buses 15 25 are encoded to avoid erroneous enablement.

Whole System

Figure 2:
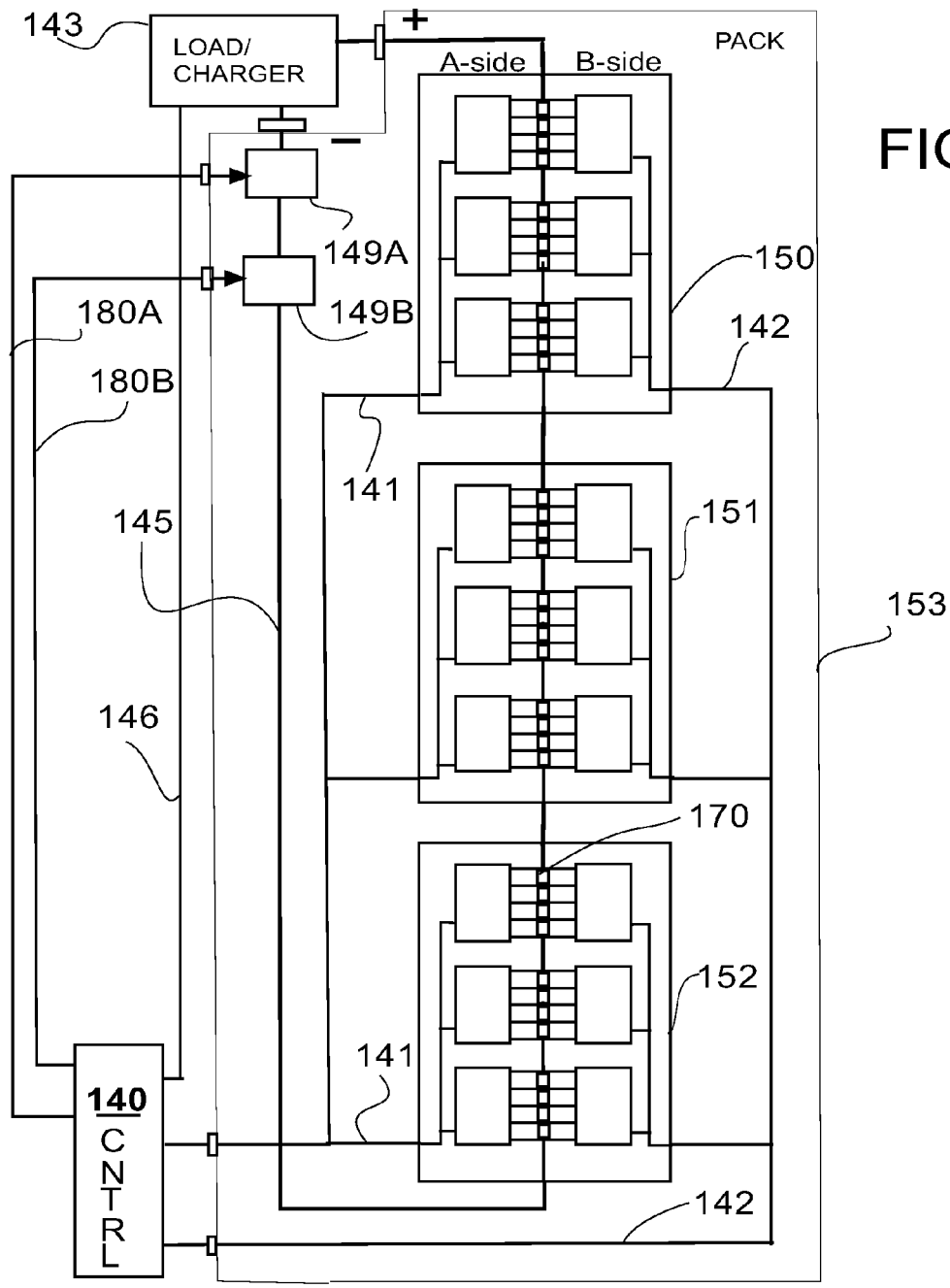
FIG. 2 is a block level diagram of an example BMS system connected to a load and charger.

FIG. 1 shows a high-level block diagram of the entire first example system. Multiple electronic modules constitute each side. As diagramed, each module controls four cells 170. Three modules compose a subsystem. In turn, three subsystems comprise both an A- side and B-side system 150 151 152. A central controller computer 140 is connected to all A-side modules via an "A" serial bus 141. Analogously the B-side modules are shown in communication with the central control computer via a "B" serial bus 142. In this first example the well-known CAN bus is used. FIG. 2 shows a block 143 (representing both the load and the charging source) for the system and power connection 145 between the pack 153 and the load/charger. Via a third CAN bus 146 a BMS control program running on the central controller can provide parameters to regulate charging, including disallowing charging as well as regulating the load. Sensors for measuring system current and total pack voltage can be located in the load/charging block and could provide that information to the central controller. The central controller also has the capability for measuring system current and total pack voltage. The central controller also has the capability to directly disconnect the battery from the load/charger if necessary. This can be accomplished by either of two circuit interrupters 149A 149B in series with the packs' output. As shown in FIG. 2, they are respectively controlled by unidirectional, dedicated signals 180A 180B from the central controller 140.

It should be noted that there are aspects both of known BMS functionality as well as implementation specific issues that can be important to practical fault-tolerant operation of a BMS system. The examples presented are not exhaustive descriptions to level of production specifications and may omit discussion of both BMS art and robust system design art that are known and that are not central to the teachings herein. Fault tolerant system techniques are taught in the book: Digital Avionics Handbook, Second Edition-Cary R. Spitzer (Editor) CRC Press, NY, N.Y. 2006.

General BMS Functions

As mentioned above, there are many algorithms and schemes for state-of-charge tracking, modeling, and estimating known to those skilled in the art. There are also many approaches as to when and how to initiate balancing. The teachings herein are not tied to particular BMS operating algorithms but rather to providing a fault tolerant platform for performing those algorithms. Therefore, this discussion is focused on those aspects of module operation associated with testing and with fault tolerance. In addition, the details presented in this example do not provide an in-depth discussion of temperature monitoring. Temperature monitoring is a known aspect of many BMS systems and is supported by the off-the-shelf BMS ICs referenced as used in this example. In fact, many of these off-the shelf ICs implement temperature and other measurements in a manner very similar to the way they measure voltage, and the techniques described in reference to voltage measurement could correspondingly also apply to these other BMS measurement functions.

System Level Operation

The central controller communicating commands to the various A-side and B-side modules via the CAN buses accomplishes monitoring of the various cell and battery parameters. The modules are stepped through actions by these commands to measure and report back to the controller they measured parameters. They may include cell voltages, cell temperatures, values of the cells, battery temperatures, pack voltage, and pack current. The rest of this operation discussion focuses primarily on the cell-by-cell voltage measurements.

Program modules within the BMS can keep a real-time running account of the state-of-charge (SOC) of each cell, and other parameters affecting the condition of the battery. A function of this BMS is to use computed data, including SOC estimates, to regulate charging and discharging of the battery in a manner that limits the cells to a safe operational state. It also manages the relative SOC between the various cells for effective use and usage life. In order to accomplish these functions, a facility for measuring and balancing on a cell-by-cell basis is employed as is known to those skilled in the art. A variety of SOC calculating and cell-by-cell balancing algorithms and techniques are also known to those skilled in the art.

Redundant Aspects

Due to being partitioned into subsystems with only limited subsystem-to-subsystem interconnects (e.g., serial digital bus), it would be clear to those skilled in the art that, given careful design, failures within a subsystem could generally be confined to that subsystem and furthermore that failures within an individual module, could be confined to that single module within the affected subsystem. One way to describe this is that each module is in a distinct "fault domain". If module A suffers a single point failure it could affect the ability to monitor four cells but the other A-side modules associated with other cells would generally keep functioning. Therefore, the majority of cells would continue to be monitored by both an A-side and a B-side module under the case of an initial single point failure. In this system-level view, the software programs of the centralized controller perform general battery management functions. These general BMS functions are well known and performed in many other systems. In addition, software programs running on the central controller continually test the various modules.

This function is accomplished by built-in testing of each module, individually, without a specific requirement to compare A-side and B-side readings, although such a cross-compare could provide additional diagnostic information. It notes modules that are untrustworthy and then takes necessary actions to isolate them into an inactive state. As long as every cell in the system can be reliably monitored and balanced by at least one module, and no other problem conditions are present, normal BMS operations might be continued. However, in most embodiments there will also be overall criteria for general robustness that could be used to cease normal operations based on the total number and character of the accumulated faults. In addition, there is a "paired balancing" technology included in this first example system and described below that can, in some cases, allow for normal operation even if every individual cell is not able to be monitored and balanced in a conventional manner.

Figure 3A:
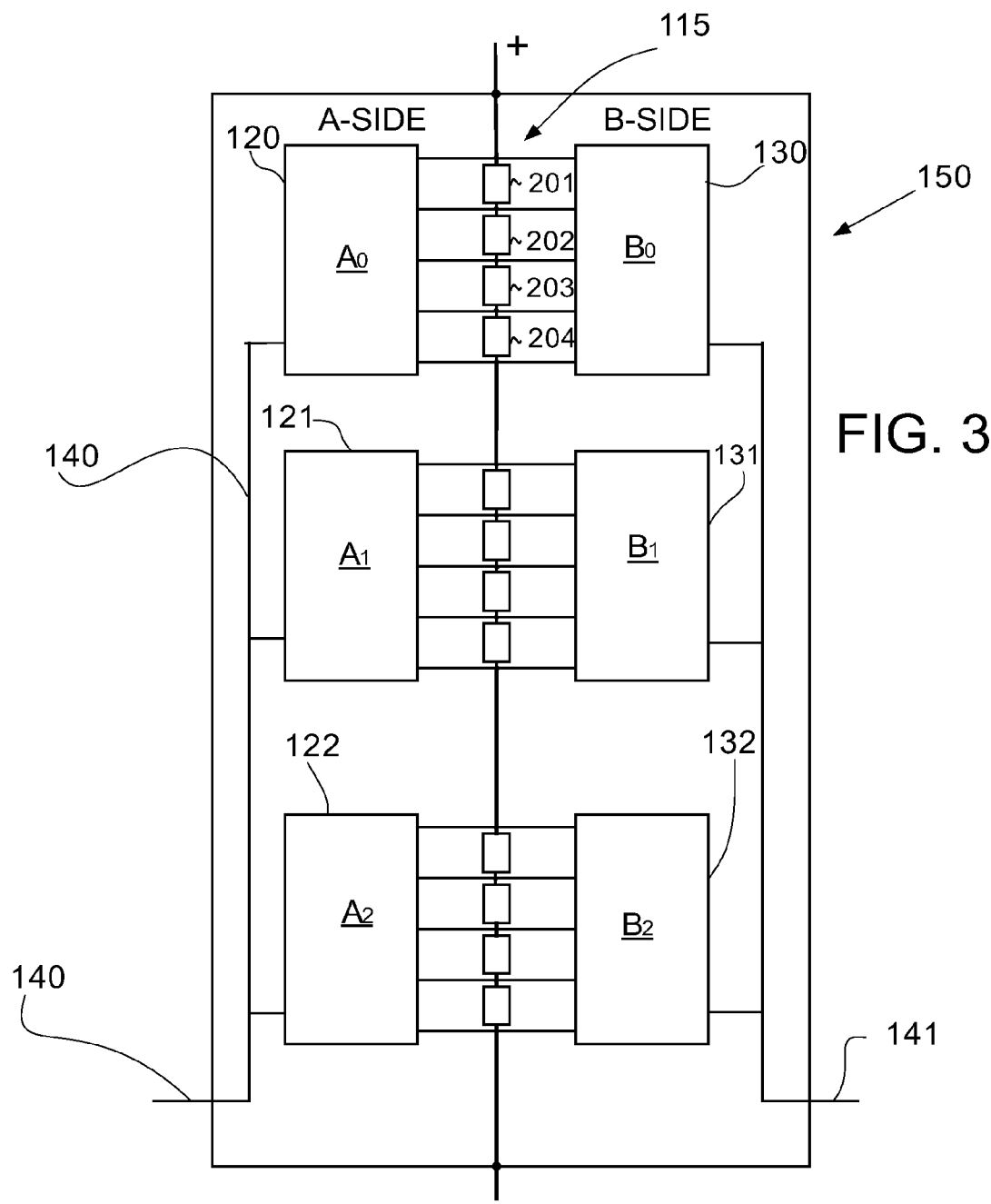
FIG. 3A is an expanded block level view of one subsystem of the system of FIG. 2.

Going down a level in the system hierarchy, FIG. 3A shows one subsystem 150 in isolation. It has four modules on each side. An A-side module 120 and a B-side module 130 are shown connected to a common set of four cells 201 202 203 204.

Figure 3B:
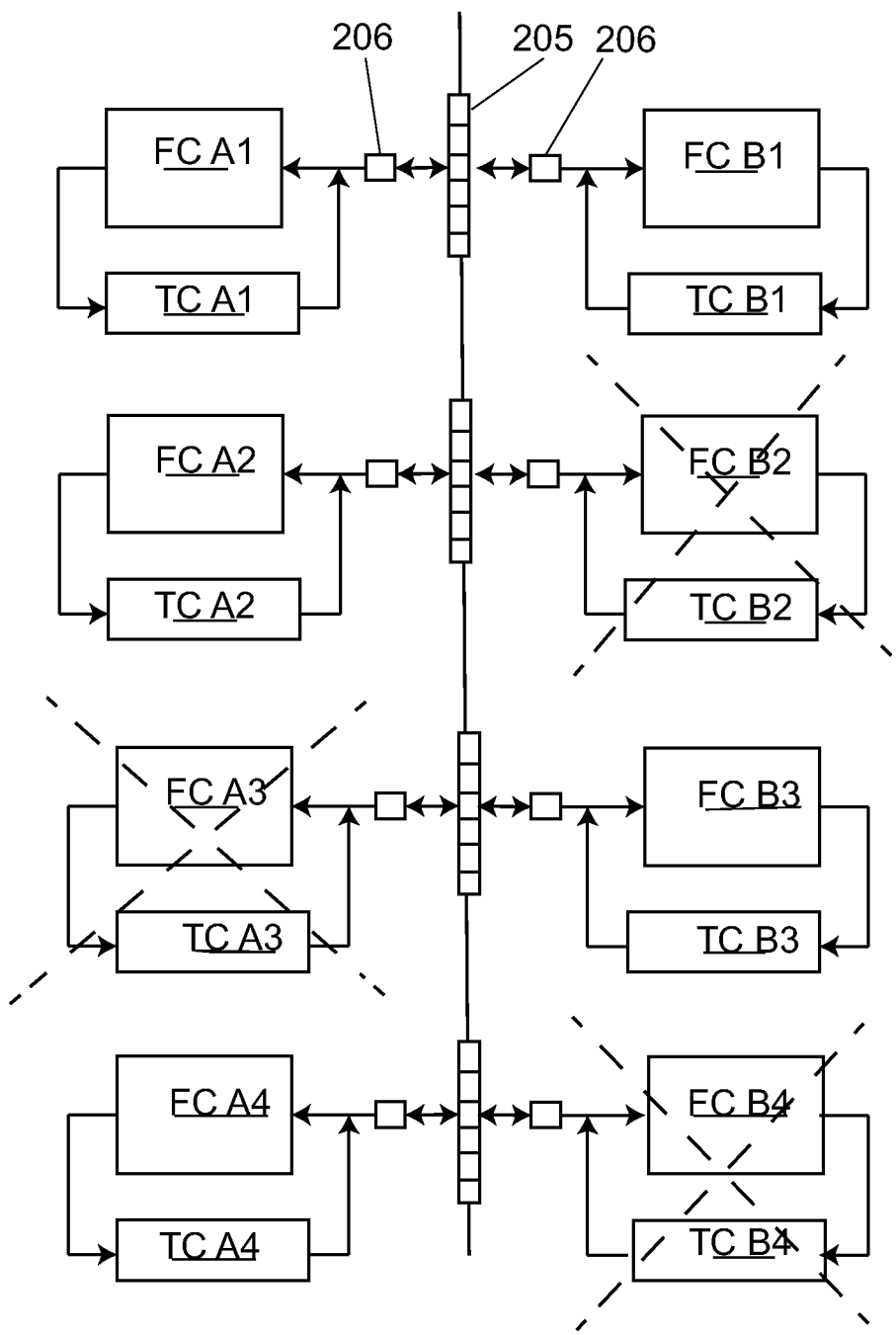
FIG. 3B is a block diagram view of a portion of an example system showing several sub-portion as failed but all cells nonetheless managed.

Partitioning providing increased coverage for $2^{nd}$, $3^{rd}$, and later faults For example, in a 320-cell system partitioned into 8-cell A-side and B-side modules there would be 40-paired modules or 80 modules altogether. After a first failure in one module there will be 39 pairs of redundant modules still functioning. For a second fault to put the system in a reduced operating state, it would need to be in the single module of the 79 remaining operating modules that is paired with the module of the first fault. Therefore 78/79 (about 99%) of the second faults would be in a module covered by an operating mate. Therefore, the operating state would not be degraded significantly by the vast majority of second faults. In turn, the site of most third faults would also be in modules whose function is still covered by a paired redundant mate. In FIG. 3B an example system is seen with four A-side modules and four corresponding paired B-side modules. The A1 module has a functional circuitry portion FC A1 and a test circuitry portion FC A1. While the voltage measuring circuits of the A1 module will not likely interfere with the attached cells 205, a fault in the charge-balancing portion of the circuitry could prevent the B-side module from managing the common cells. Therefore, an isolation mechanism 206 is provided between each side's circuitry and the cells. Since the A and B-sides are isolated and the A1 module is fault isolated from both the A2 and B2 modules, a matrix of independent circuits is formed. The three X'ed modules of FIG. 3B represent positions of a first, second, and third fault. In this case, the system will continue operating with full function and full safety. In the example systems isolation is effectively provided for by the requirement for two independent enables for any action that affects the opposite side.

Module Level—STIM—Structure

This discussion will now focus on the structure of an individual module. FIG. 3A shows a portion of $A_0$ module's 120 internal structure. The functional circuitry is shown and the stimulation circuitry is shown. Five connections 161 162 163 164 165 respectively, for the four managed cells, are shown at the right of the illustration. A sixth connection to the module 166 is for the CAN bus interface and transceiver 263 made up of a receiver 269A and a transmitter 269B.

The module's functional circuitry includes an analog multiplexer 261 and an analog to digital converter (ADC) 260. State machine based control logic circuitry 262, a serial bus interface 265, and a select register 266 are other circuit blocks in the module. These aspects of the module can be constituted by a commercial-off-the-shelf (COTS) BMS integrated circuit such as Linear Technology's LTD part number 6802, Analog Device's part number AD7280, or others. Custom ASICs or a combination of lower-level components might also be used. This first example assumes the Analog Device's part number AD7280.

Figure 4A:
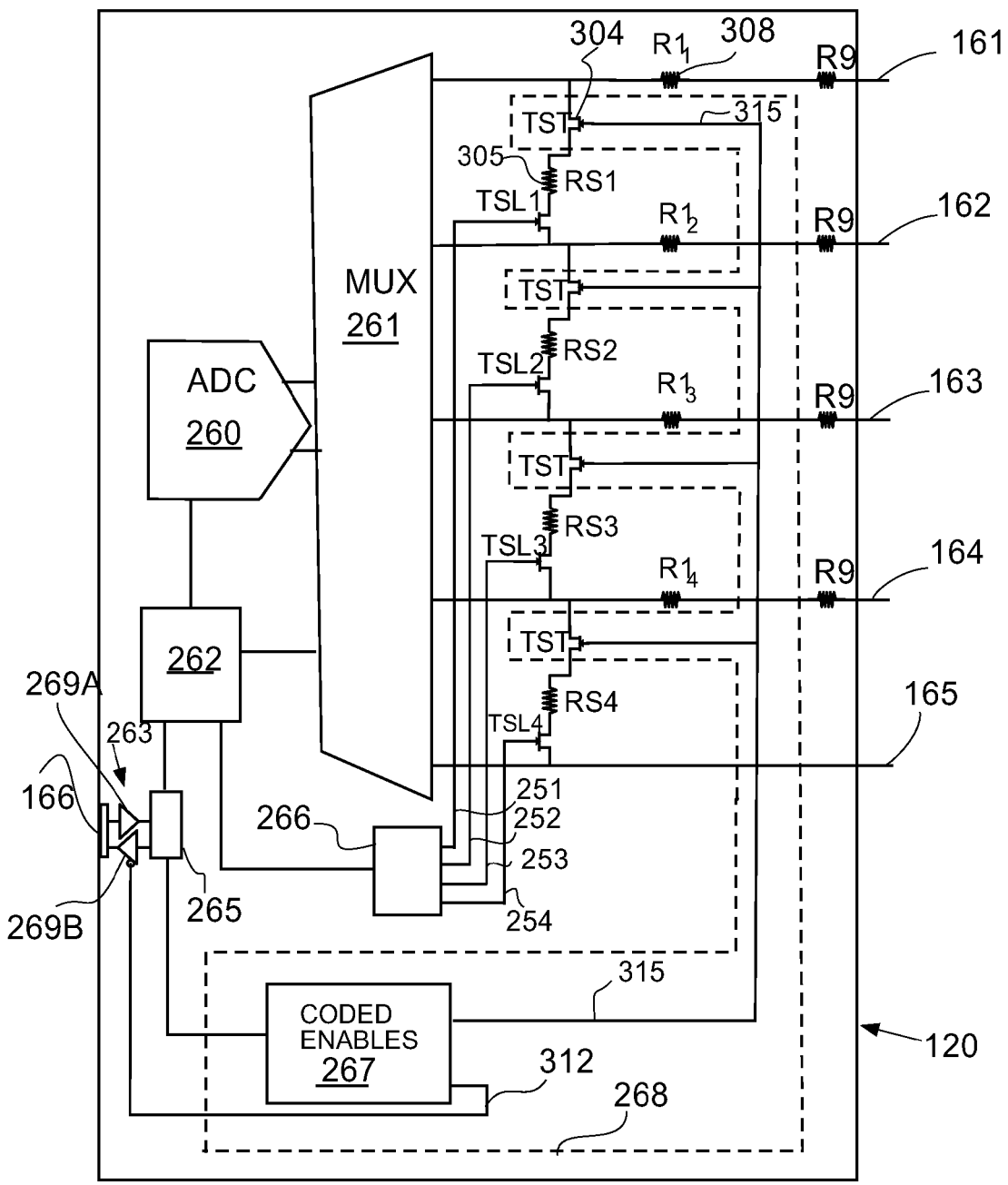
FIG. 4A is an expanded diagram of one of the modules of FIG. 2 particularly showing the stimulation circuitry and omitting certain other circuitry for clarity.

External to the BMS IC in this example implementation are an array of resisters and FETs as well as enabling circuitry. Across each cell connection pair 161/162 162/163 163/164 164/165 are a similar set of FETs and resisters. Although the entire schematic is shown in FIG. 3D, for ease of description and explanation three portions of this circuitry are shown separately in FIGS. 4A, 4B and 4C respectively. Focusing on the pair 161/162, intended to be connected to cell 201, FIG. 4A shows the FET $T_{STIMULATION}$ (TST) 304 for enabling current flow through stimulation (STIM) resister RS1 305. There is a second FET in series with RS1. FET Tselect line (TSL1), controlled by a select line 251 must also be activated before TST can enable current flow. The other three cells intended to be connected to this module have corresponding FETs and resisters. Note that the STIM resistors RS1, RS2, RS3, and RS4 are of mutually distinct resistance values.

Enabling current through particular STIM resistors would need two actions by commands over the CAN bus. One is to load a binary value which commands "enabling" in the select register 266 and two, by activating the STIM enable line 315. This enable line emanates from an enable logic circuitry block 267. In order to prevent unintentional enabling, the commands over the CAN bus for turning on the various enables are redundantly encoded. A CRC check of the data field done within the Protected Enable circuitry 267 insures that the STIM enable does not unintentionally become asserted. In addition, to prevent a "stuck on" case, the enable logic circuitry includes a time-out timer to disable any enable signal in the absence of a STIM disable command being received over the CAN bus.

Dashed lines surrounding the protected-enable logic circuit block 267, the enable line 315 and the four TST FETs are to indicate that this circuitry and its mutual interconnects are implemented by electronic components and connections that are in a separate and distinct "fault domain" from that of the rest of the module. By distinct fault domain, it is meant that, to the extent required given the application, no single failure mode in a first fault domain will constitute a fault in any second fault domain. For the purposes of this teaching, fault isolation includes random electrical, electronic component, printed-wiring-board (PWB) and other interconnect failures, either physical or electronic. Having the primary functional circuitry and the circuitry for testing that functional circuitry in distinct fault domains, each separately commanded over the CAN bus might be thought of as giving the testing scheme "fault affects isolation" from the operational electronics that are being tested.

Module Level—STIM—Operation, Built-In Testing

Validating Multiplexor, ADC, Selector Register and CAN Bus Interface

This is a method of applying a known external stimulus in order to test the module's measurement ability. This validation is done by commands to the module to: (1) first measure the four cell voltages normally, (2) applying a known voltage divider induced stimulation voltage, respectively, to each of the cell voltages and re-measuring, then (3) comparing the first voltage measurement of each cell with the second measurement. The difference, in this case, the ratio, in each measurement must equal the precise predefined stimulus ratio assigned uniquely to this cell in order to determine that the tested portion of the circuitry is properly functioning.

The stimulus is specifically predefined such that each cell's stimulus value is unique and the total set of stimulus voltages supports validation of the full range of the ADC.

Consider the case of the voltage that would be presented by a connection with a particular cell 201. It would be read initially without either the FET TSL1 or the FET TST enabled. Due to the structure described above, even in the case of a single point failure related to either of these FETs, no current will flow in $R_{STIM1}$ (RS1) and a direct measurement of the respective cell voltage will be taken through a relatively high resistance $R1_1$. In this case it is retrieved by the central controller over the CAN bus. Next, by command over the CAN bus a value is written in the select register 266 that has the bit for the first cell's select 251 on. In addition, a command over the CAN bus sets the STIM enable line 315 active. This command relies on a CRC in the data field that is verified by circuitry within the protected enable logic block to protect against unintentional enablement. This CRC check is unrelated to any CAN bus protocol CRC. With both the TST FET and the TSL1 FET conducting, a voltage divider of $R_{STIM1}/(R_{STIM1}+R1_1)$, neglecting the effect of the buffer resistor R9 for purpose of clarity, is placed between the actual cell voltage and the primary functional circuitry of the module. If no failures are present that affect this path, the first and second voltage measures will differ in the ratio of the voltage divider.

Each of the "dividend" resistors RS1, RS2, RS3 and RS4 is of a distinct value. The $R1_1$, $R1_2$, $R1_3$ and $R1_4$ in this example are all of the same resistance value. With distinct $R_{STIM}$ values for each cell, the voltage dividers have ratios that differ significantly from each other and cover a wide range. Two testing purposes are served. By having each cell position of a module provided with a hard-wired, distinct ratio set by passive components, "masquerading" failures can be detected. Masquerading is a failure, generally by a multiplexer or associated control logic, that results in measurements being made of the wrong input. This is detectable if the stimulus is predetermined and known and distinct for each input. The second benefit of this approach is detecting a wide range of ADC failures. The actual cell voltages the ADC will be called upon to measure will range from approximately 4V to approximately 2 volts. However, the stimulation voltage dividers represent a variety of ratios including some very low fractions. In the normal course of testing, the ratios will be applied to cells, both at their maximum voltage and minimum voltage. A wide variety of measurements at voltages across the ADC's range will be made. A stuck bit in the ADC circuitry for example, would be detectable by the central control logic due to the wide range of voltages and ratios. Preferably, the STIM ratios are selected such as to support validation of the full range of the ADC.

Module—Open lead testing structure and operations

Figure 4B:
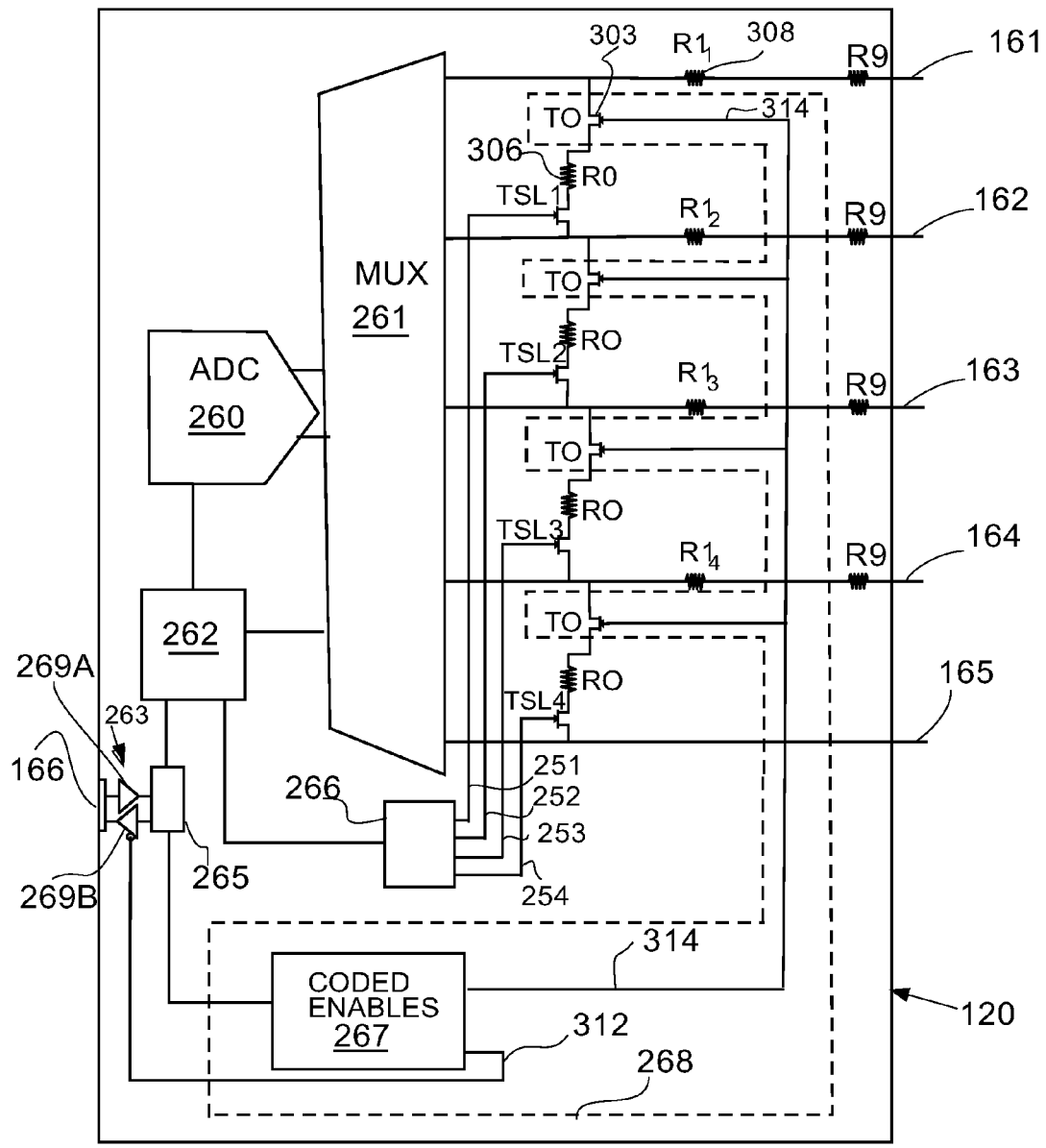
FIG. 4B is an expanded diagram of one of the modules of FIG. 2 particularly showing the open lead testing circuitry and omitting certain other circuitry.

Very analogously to the module's voltage measurement testing via selectively enable networks of resistors, is a second built-in test for open leads between a module and a particular intended cell. A connected cell, at any level of charge, will have impedance within a pre-known range. A broken lead will only reflect parasitic impedance. As seen in FIG. 4B a set of enabling FETs $T_{OPEN}$ (TO) and a set of resistors $R_{OPEN}$ (RO), very analogous to the TST and RS 1-4 as seen in FIG. 4A, are selectively used to load their respective cell leads. With a known range of normal cell impedance and a known range of parasitic impedance of an unconnected lead, those skilled in the art will understand how to select a value for $R_{OPEN}$ that will allow voltage measurements with and without the resistor in place to readily be used to detect an open lead by impedance measurement. The enable for open testing is commanded by a message using CRC within the data field received over the CAN bus and cleared by a time-out circuit if not cleared by a CAN bus command in a timely fashion. In some systems, the range of impedance values in the various conditions may be such that the open circuit load and the voltage divider might be both be accomplished by the identical FETs, enables and resisters, eliminating several components. In addition to testing for cell, lead malfunctions that produce a "clean" open there is another class of lead problems this first example system can detect. A lead might be disconnected from its intended cell but might also be erroneously in contact with another cell or other low impedance source. This error condition might pass an impedance measurement, but the voltage reference point would not be correct and our measurement of impedance requires the correct reference. Therefore the "open lead" program module also verifies that each measured raw value is plausible. For example, in a system with 4-volt cells, a cell reading of 7 volts or of 2 volts are systems that probably have a lead touching a terminal of a cell nearby the intended cell.

Module Level—Operation—Cell Balancing

In order to manage a group of lithium-ion cells for safe and effective performance, battery management systems generally employ some scheme and structure for selectively adjusting the charge for a cell that it detects as approaching an undesirable charge level, in light of the state of charge of the other cells in the battery. Some systems also have a structure that allows for charge to be selectively moved between individual cells. Those skilled in the art will know of multiple schemes and structures for determining when, to what extent and how to accomplish cell balancing. This teaching is focused on the enablement of balancing, and providing for balancing in a fault tolerant manner.

Although not an aspect of the built-in testing, balancing a cell by drawing down its charge is initiated and regulated in a very similar manner as to the above testing discussions. Other than balancing, the other BMS functions are typically passive measurements, calculations, and annunciation. Protecting balancing from being initiated by a single failure in a single fault domain is valuable in order for a failed module to "do no harm" and allow its paired other-side module to operate without interference.

Erroneous balancing can compromise the immediate battery capacity. Further, unintended balancing by a module on one side will prevent the other side from independently managing that cell. Therefore the balancing circuit shown in FIG. 4C has many aspects in common with the two previously discussed test facilities. The $T_{BALANCE}$ (TB) FETs and $R_{BALANCE}$ (RB) resistors provide a structure for dissipative cell balancing. Again, one of the select enable lines 251 252 253 254 for the specific cell position and a balance enable signal 313 must be active to allow current to flow in any of the various $R_{EBALANCE}$ resistors. The balance enable is commanded active by an encoded, redundant command over the CAN bus and disabled by time-out circuitry if otherwise not disabled in a timely fashion. Note that the $B_{ALANCE}$ FETs are connected "closer" to the cell leads than the other FETs. Measuring is intended to draw as little current from a cell as possible, thus the R1 resistors have an appropriately high resistance. Balancing, in contrast, is intended to drain current from the desired cell, or transfer the current to another cell. Detecting a failure in balancing is possible by voltage measuring during an intended balancing period, with balancing turned-off. There is a side-A and a side-B balancing circuit, either of which is fully capable of providing the balancing function. If it is detected that either of these circuits fail to produce the desired balancing effect, it is judged faulted, and disabled from further balancing influence on the cell. The other circuit is then available to provide the balancing function in a fully independent manner.

Figure 4C:
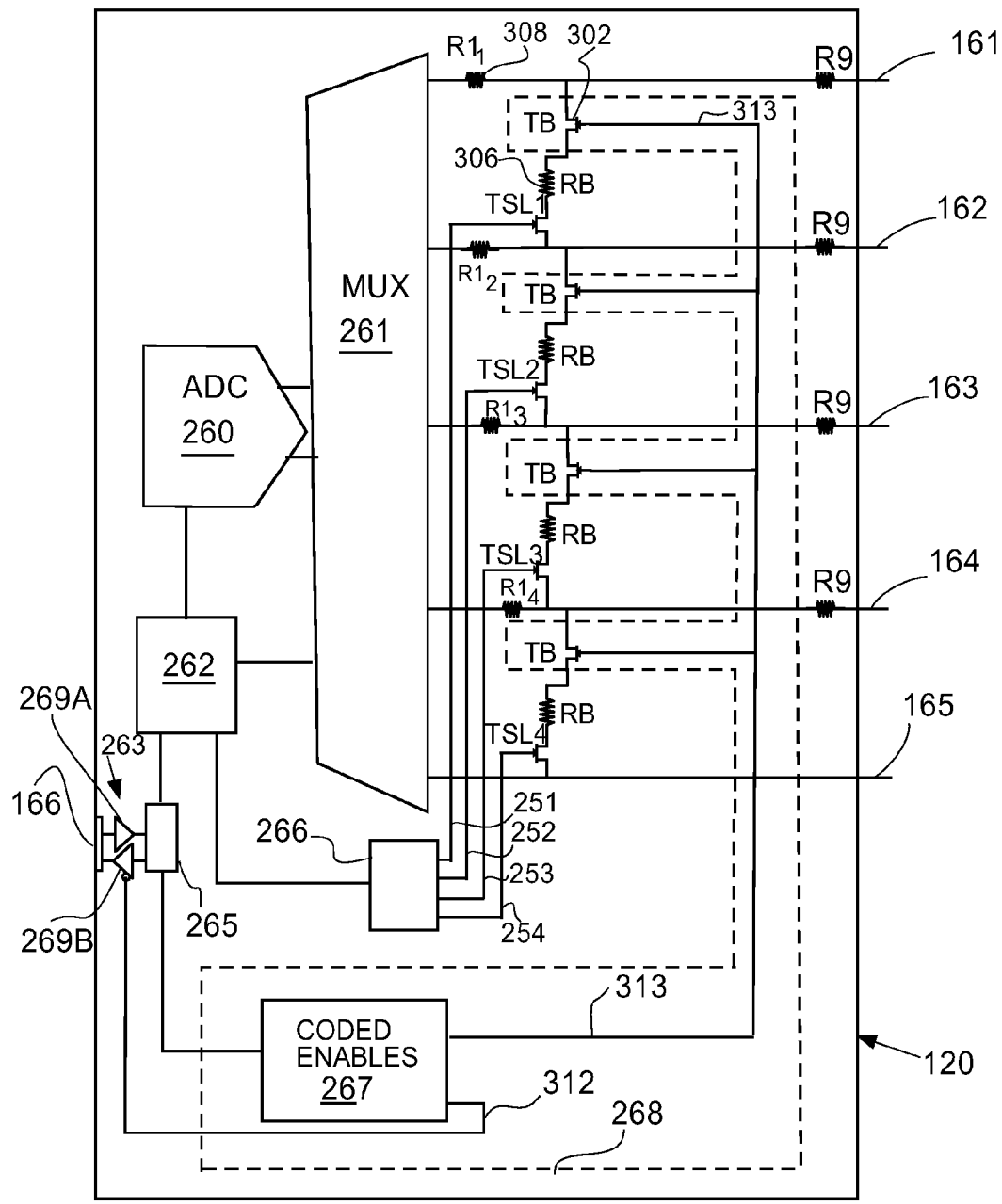
FIG. 4C is an expanded diagram of one of the modules of FIG. 2 particularly showing the balancing circuitry and omitting other circuitry.
Figure 4D:
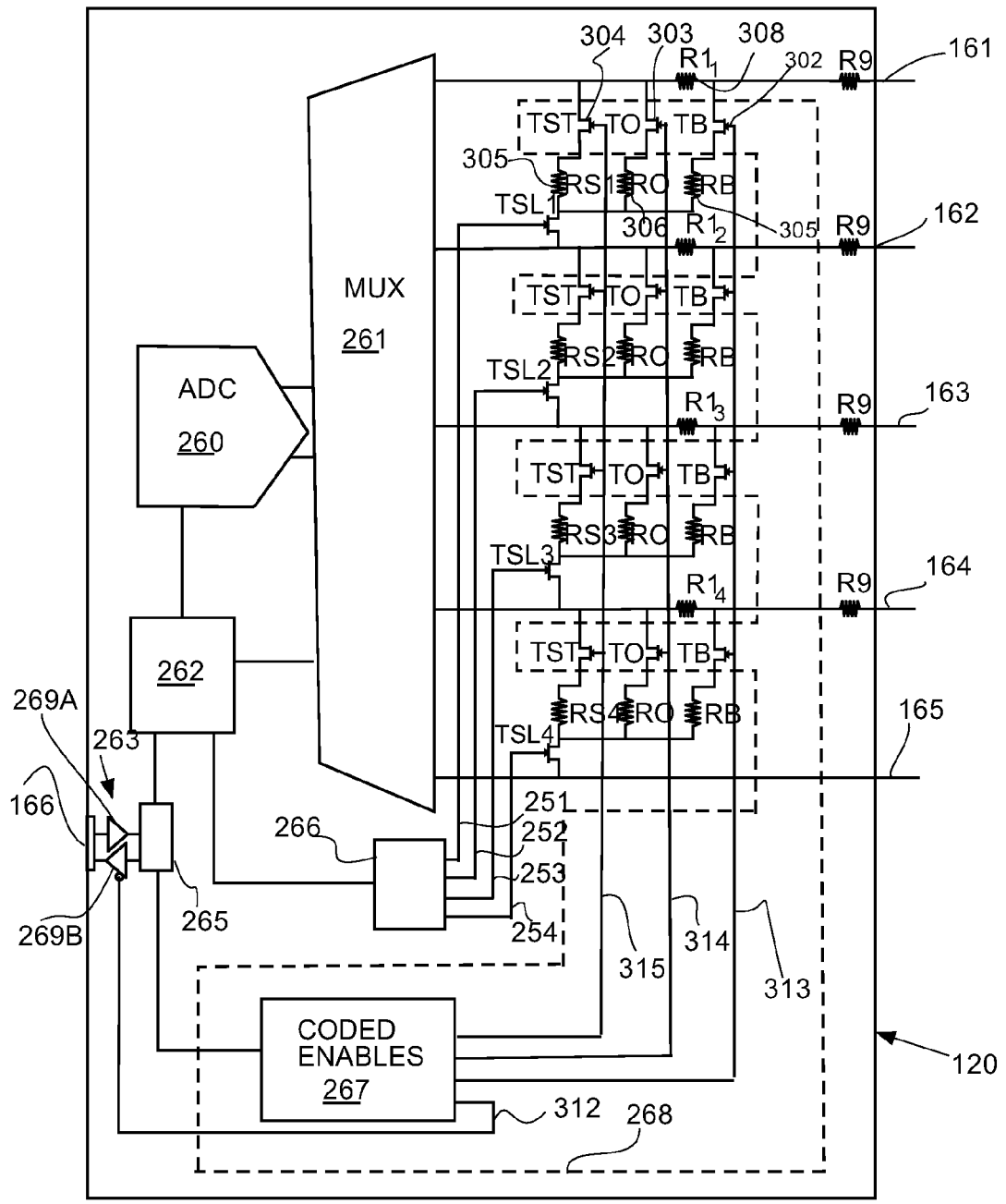
FIG. 4D is an expanded diagram of one of the modules of FIG. 2 showing the entirety of the circuitry shown individually in FIGS. 3A, 3B, and 3C and their interrelationships.

The three sets of functions described and diagramed isolated and separately in FIGS. 4A, 4B, and 4C are shown as the entire module together in FIG. 4D.

Alternate Implementations of STIM, Open Testing and Balancing Circuits

Figure 5A:
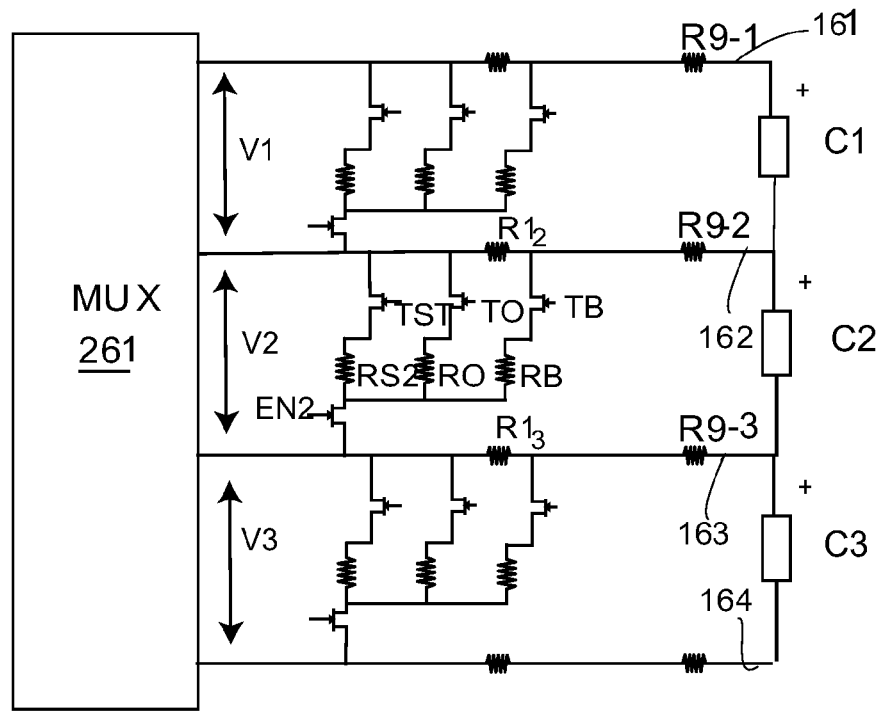
FIG. 5A shows a portion of the circuitry of FIG. 3D.

A portion of the circuitry of FIG. 4D is shown in FIG. 5A to illustrate several points. One point is that these three functions of stimulation, open testing and balancing can each be viewed as selectively enabled voltage dividers. With judicious choice of values the three sets of voltage dividers could be reduced to two or even one voltage divider, Looking at the circuit related to cell 2 it is seen that both the stim resister RS2 and the load resister for load testing RO are on the same side of R1-2. R1-2 is a relatively large resister, possibly 10K Ohms. This allows the application of either RS2 or RO to draw very little charge from cell 2. It will be clear to those knowledgeable in the art that the functions of the stim circuitry and the open testing circuitry could be implemented in a unified manner requiring only one resister and one FET per cell position.

During balancing, the current flowing in R1-3 and R9-3 has the effect of reducing the as-measured cell 2 voltage V2, but also increases the voltage V1 and decreases the voltage V3. These effects are easily predeterminedaly calculable and can be monitored in some versions of these systems to further verify the properly connected, non-failed status of the circuitry.

Alternate Circuit for Balancing and Stimulus Injection

Figure 5B:
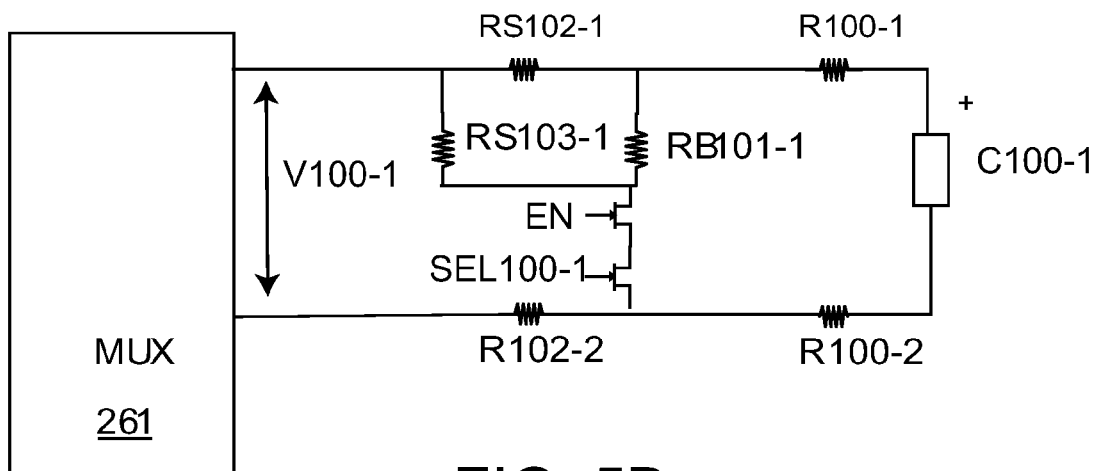
FIG. 5B shows an alternate circuit for stimulation and balance.

FIG. 5B shows an alternate circuit that combines the balancing and stimulus enables. This requires fewer components than the previous example implementations. Only one channel is shown in FIG. 5B for clarity. While it does require two FETs to each receive an independent enable signal SEL100-1 EN. When both signals are activated balancing and stimulation are simultaneously applied. The balancing current flows through the low impedance path of R100-1 to the balancing resister RB101-1, returning through R100-2. If balancing is intended this current flow is continued until a particular amount of charge is removed. To get an unadulterated measure of the cell's C100-1 voltage, the select or enable can be briefly inactivated.

If stimulus is intended the select and enable are only engaged very briefly in order to not wastefully dump charge. While activated, the second voltage divider RS102-1 and RS103-1 further divides the voltage that is presented to the multiplexor inputs. This allows each cell channel to have common values of balancing resistors but distinct values of stimulus voltage dividers. This same circuit can also be used for providing a load for open lead testing.

Detailed View of "Open Circuit" Condition

Figure 6A:
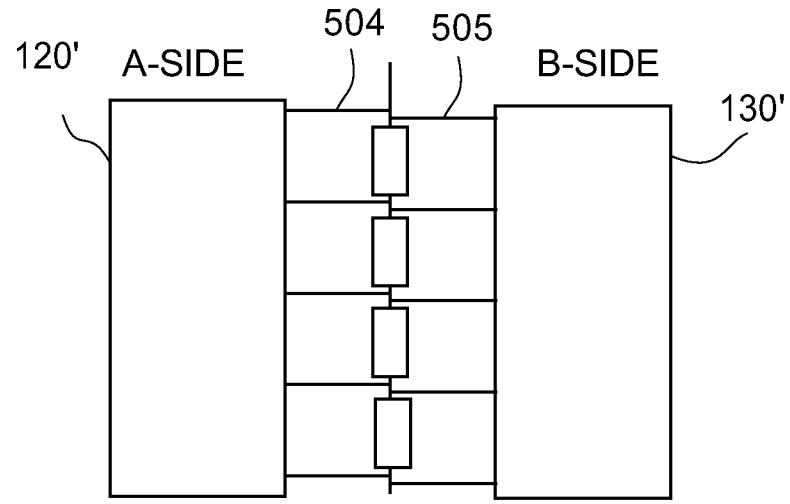
FIG. 6A shows a system in which the A- and B-side modules have independent connections to their common cells.

FIG. 6A shows two example modules (A and B-side) connected to a common set of cells. Unlike similar illustrations within FIG. 3A, the connections to the cells are shown offset. Schematically, this indicates that each module has a separate and distinct connection to their common cells. In a system wired in this manner, one side could see an open circuit while the other side still had the cell's management in hand due to its' redundant circuitry being connected to the common cell via a redundant interconnect.

Figure 6B:
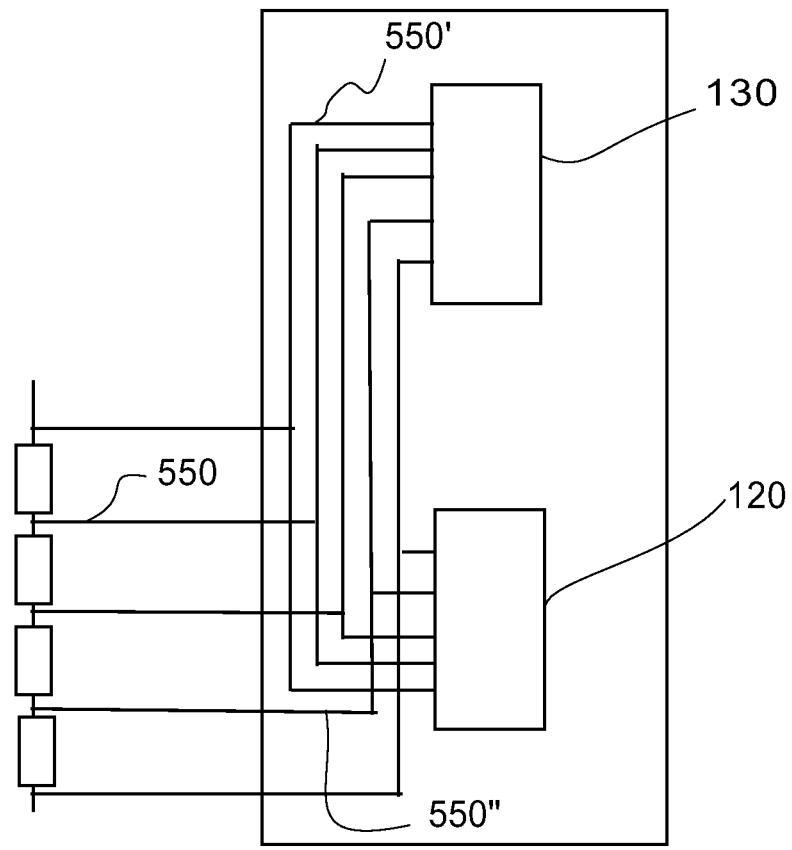
FIG. 6B shows a system in which the A and B-side modules have common connections to their common cells as well as some side-unique interconnections to the cells.

With fifty or one hundred cells, it may not be cost effective to have two unique interconnects to each of the cells and interconnects can often be a weak link in a system and dual-redundant sense connections to the cell might be less than optimal for that reason. FIG. 6B shows a wiring diagram that corresponds to the module/cell/module schematics of FIG. 3A. There is a common set of leads from the cells to in this case, a single printed circuit wiring board. On that board the connections to the cells are split into one copy going to the A-side module 120 and another to the B-side module 130. Those skilled in the art will recognize that a configuration as in FIG. 6B can suffer from at least three major classes of open circuit cases. Either the A or B-side might be disconnected from a 495 common cell lead 506, or the common cell lead may be broken. For example, in FIG. 7A, looking at the 2nd cell 561, the common cell lead 550 between the battery cell and the modules could be open disconnecting both modules from one side of that cell. In contrast, the wire 550' as seen in FIG. 6B from that leads to the B-side module 130 might be open disconnecting only that module from the cell. Conversely, the wire of 550" may be open 500 having the opposite effect. In the case of the common cell lead being broken, neither module could monitor and balance the two affected cells on an individual basis.

Figure 7A:
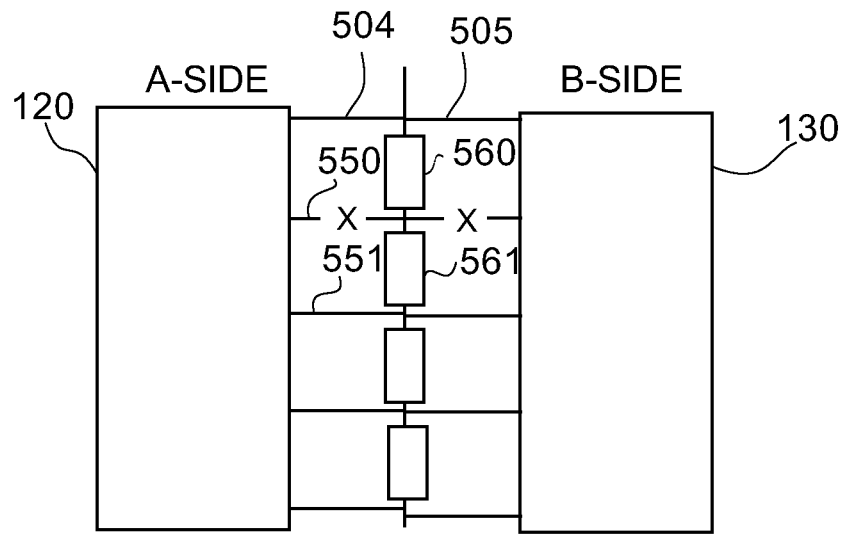
FIG. 7A shows a diagram of an A-side and B-side module in a schematic manner similar to that of FIG. 3A with both modules having an open circuit on the same lead.

FIG. 7A brings this case into the familiar view of FIG. 3A. In a schematic manner the two "X"s indicate that both connections have failed, but, physically it most likely is one failed common lead.

Paired Balancing Hardware

Figure 7B:
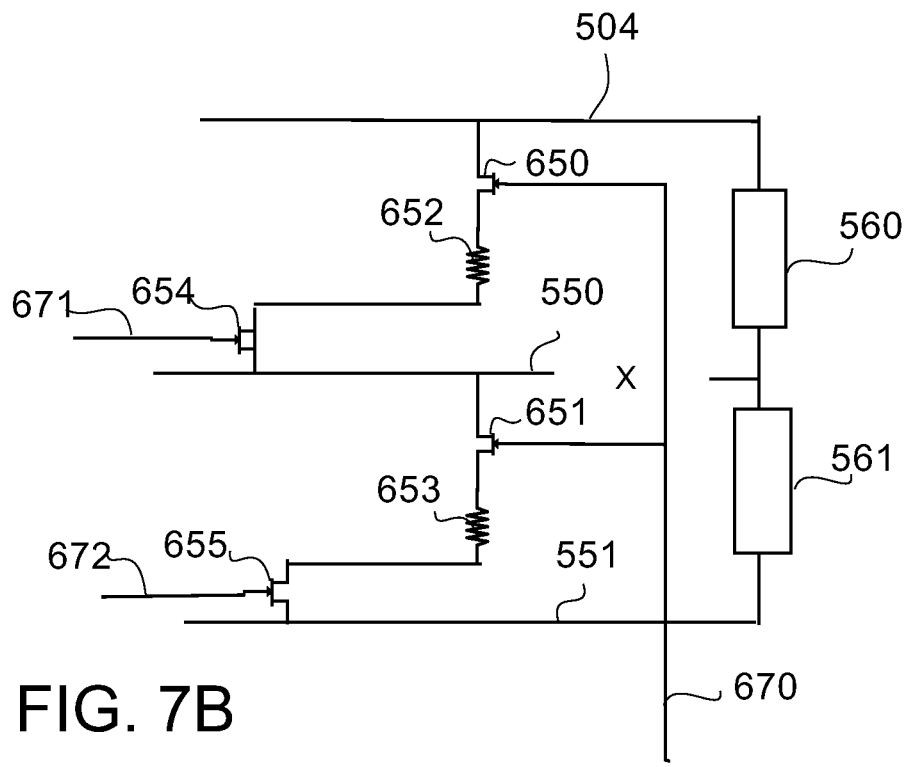
FIG. 7B is a simplified schematic view showing a dissipative balancing for two cells for which their common lead is disconnected from the balance circuit.

As seen in FIG. 7B, when a lead 550 from between two cells to the electronic modules is disconnected the paired voltage is still available to the electronic module by looking at the upper lead 504 of the upper cell 560 and the lower lead 551 of the lower cell 561. The pair voltage appears across these points to be read by the module's ADC. For 510 paired balancing, the common enable 670 would be activated and both cell's select lines 671 672 would be activated. There for four FETs 650 651 654 655 would be conducting allowing current to flow through the two cell's balancing resistors 652 653 causing a dissipation of current from the paired cells.

Paired Balancing

The discussion above regarding open circuit condition detecting presented a case with a single point of failure (a common cell lead broken) that can occur in this first example system that is not directly supported by a redundant facility. It is undesirable for any one fault to have this property but the cost of duplicate cabling and potential for correlated lose of both connections due to a related effect may be a factor. These teaching include a method for attempting to monitor and balance adjacent serial connected Lithium ion cells as a pair.

As seen in a greater detail of steps in FIG. 15, after loss of voltage information for a cell the example system subsequently does balancing commonly for the two affected cells. In FIG. 5B, cell 630 and cell 631 are monitored and balanced commonly.

Monitoring is performed by measuring the sum of the voltages of the two cell positions and comparing the combined voltage to twice the single cell's trigger voltage and balancing is done by activating the select lines for both cells while also activating the balance enable. Paired balancing relies on the assumption that each cell's voltage and charge is approximately one-half of the sum of the two. This assumption can be reasonable depending upon several factors. If cells are the same type/manufacture and similar age it is likely they will track each other.

In this example common balancing is also conditional on satisfaction of a well-correlated balancing history for the two affected cells (correlation requirements are dependent on cell chemistry). A record of balancing history is continually updated and held, for each individual series-cell during normal operation.

To allow for a small difference in the two cells' respective states, the "balancing point" using the sum of the cell voltages can be biased lower than what would represented by two times voltage value used as the balancing point when monitoring individual cells. Preferably it is not so low as to result in damage at the low SOC end.

The two affected cells may diverge in SOC, that is, one having more than half the total charge while the other has less than half. In this case, a situation not detectable by static voltage measurement of the pair, the underlying assumption for common balancing no longer holds. This example system, consistent with the teachings herein, uses a novel approach to detect and manage this case.

Figure 8A:
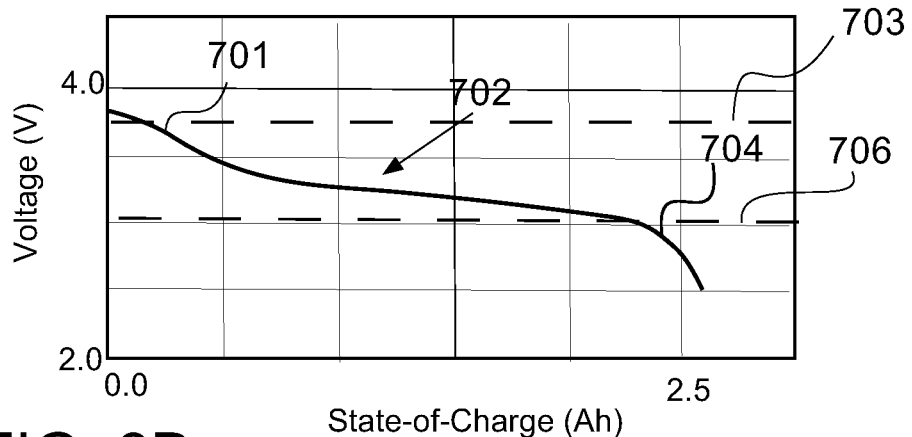
FIG. 8A shows a characteristic V vs. Q curve for a li-ion cell.

To better understand the issues involved with paired balancing FIG. 8A shows a typical nominal voltage vs. charge curve 702 for a lithium ion cell. As is known, as the cell approached fully charged 701 and also as the cell approaches it maximum discharge point 704, the V vs. Q curve has a rapid increase in the absolute value of its slope. In order to stay within the recommended relatively flat portion of the curve a system might set a trigger point for balancing at the voltage 703 near the upper inflection point and might cease discharging when the voltage 706 near the lower inflection point was reached.

Figure 8B:
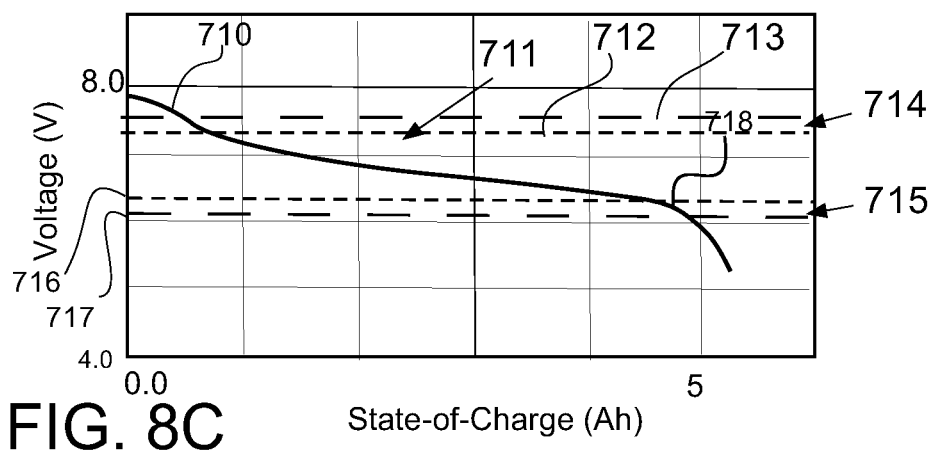
FIG. 8B shows a characteristic V vs. Q curve for two ideal li-ion cells in series.

In a paired balancing case with two matched cells the combined curve 711 would be that seen in FIG. 8B. If graphically normalized for comparison purposes, it would have the same shape as the curve of FIG. 8A, with the axis re-labeled with values 2 × those of FIG. 8A. The upper knee 710 and lower knee 718 would occur at voltages two times of those of FIG. 8A. The voltage difference between the upper knee and the lower knee is seen in FIG. 8B to be about 1.5 volts.

However, the cells might not be, or might not remain, perfectly matched with one having more charge than the other and therefore contributing more than ½ of the voltage. This would mean that although the total paired voltage was indicative of being below a fully charged state; one cell might be at that point while the other is well below it. Therefore in paired balancing the trigger points might be predetermined set to more conservatively 714 715.

Figure 8C:
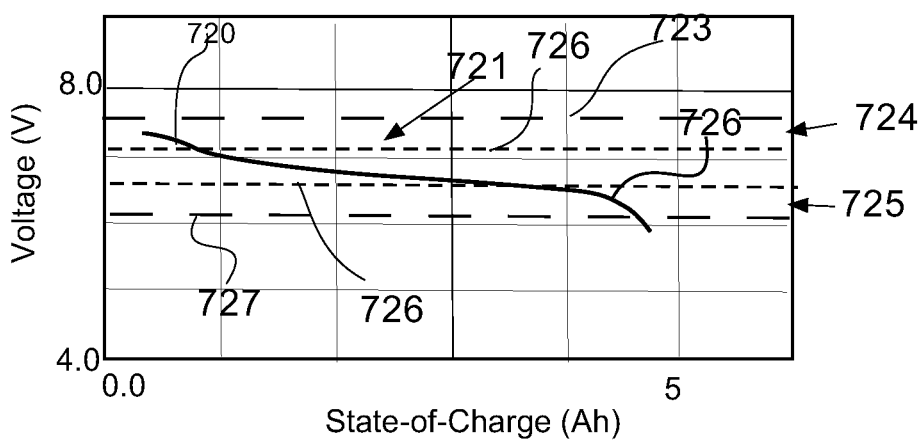
FIG. 8C shows a hypothetical characteristic V vs. Q curve for two li-ion cells in series that have different levels of charge.

FIG. 8C shows, in a somewhat exaggerated form, the case of two series cells that have different charges and different voltages. When summed, the upper knee of the most charged cell occurs first and is at a point 720 well below the nominal expected two times point 710. Similarly, when discharging the other cell will hit its lower knee 726 well before its nominal point 718. FIG. 8C shows about a 0.7-volt difference between the upper and lower knees.

The first use for this information is that paired monitoring and balancing might continue indefinitely for cells with identical part types (including chemistry), with previous balancing histories that are similar and as long as the upper and lower knees appear at the appropriate absolute voltage ranges. The information regarding where on the curve the upper and lower curve slope is changing are not in the "right place". This information can then be used in the combined curve to quantify the degree of discrepancy in the cells' respective charge. Making use of this information, this example system will shift its balancing set-voltage point downward by an amount comparable to the "shrinkage" in the delta between the upper and lower curve flattening. This will allow an extended period of confident operation, but at a reduced effective overall battery capacity. This is due to the fact that the cell, of the pair being balanced together, which has more charge will be held to an appropriate maximum charge, but the cell with less charge will upon battery discharge reach its lowest permission charge level earlier, thus affecting the capacity available from the battery as a whole.

Programmed Control

As is well known, control logic per se can be implemented in hardware ranging from discrete digital medium level integration circuits (MSI) to microprocessor systems executing purpose-designed program modules to carry out that same control logic. In the first example the control logic for performing the actions of this teaching are carried out on one or more microprocessors within the central controller. As mentioned above, there are many known algorithms for BMS functions and what is well known is better omitted. The particular program modules discussed are related to the robustness and fault tolerant nature of this BMS platform. The program modules have access to a set of data tables representing the state and history of the system.

One data table has an entry for each module to allow indication of its trustworthiness. Another data table has an entry for each battery cell containing its cell type, manufacturing date and preferably a record of events significant to its state of health. Other information includes a status bit indicating need for balancing and a value related to the degree of charge to be removed. For the A-side and the B-side a data table is maintained that has entries for each cell/side. There are separate entries corresponding to the A-side's view of a cell and the B-side's view of that same cell. These entries can contain SOC estimates, recent raw measurements, recent filtered measurements and the (binary) state of trustworthiness of that side's ability to monitor and balance that cell. Another table maintains an entry for each lead for each side. This is to indicate open circuit detection.

Figure 9:
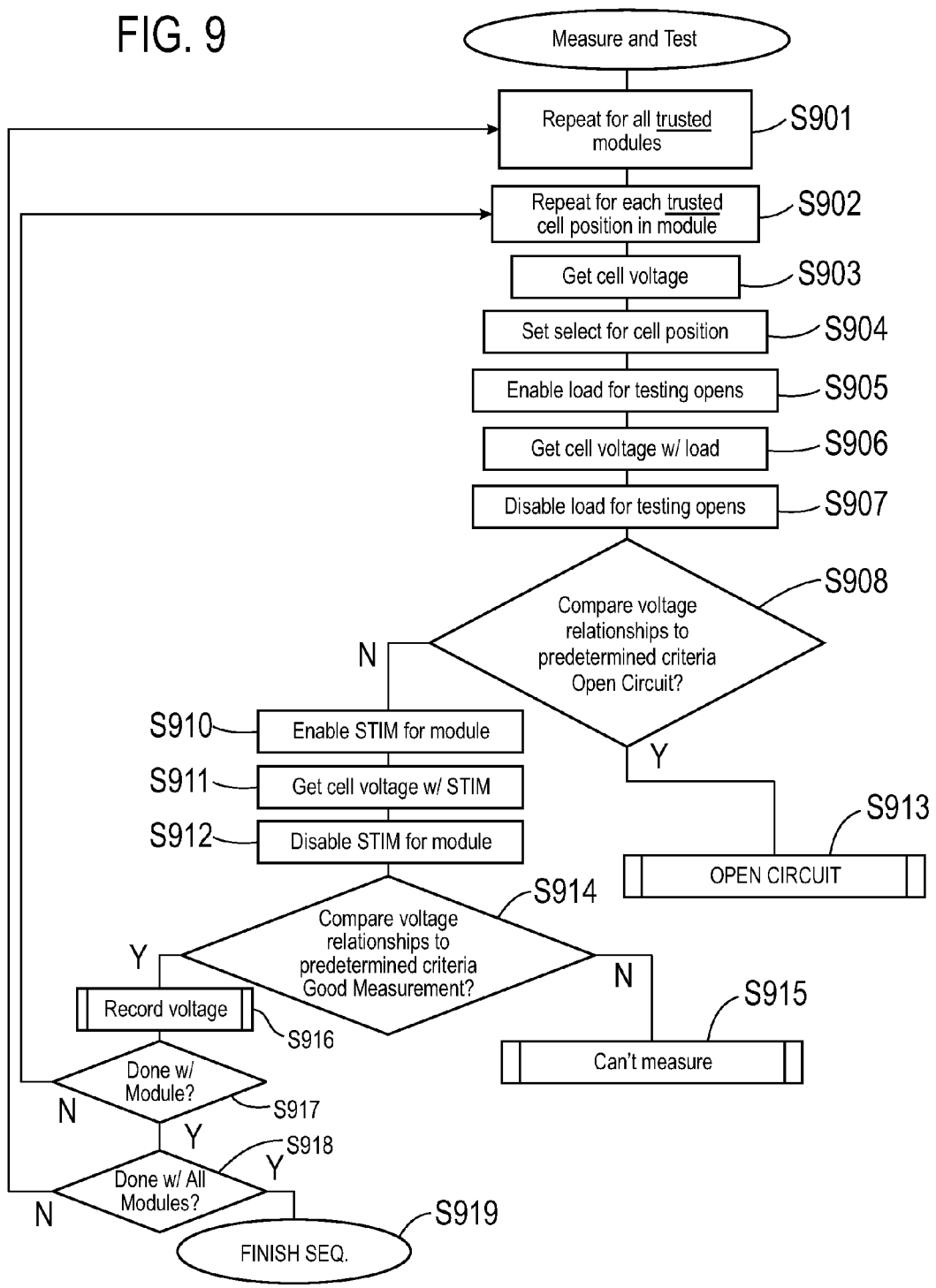
FIG. 9 is a flowchart of steps to check each trusted cell monitoring mechanism.

FIG. 9 shows a flowchart of the measure and test function of this BMS platform. This program module will be invoked periodically with a frequency sufficient to provide voltage data at a required time resolution and to detect anomalies in a timely fashion. Repeatedly S901 for all trusted modules (modules already marked in a data table as suspect or malfunctioning are skipped), all trusted cell positions of a module are evaluated S902. By cell position it is meant the circuitry and interconnect of a module intended to be connected to and to measure a particular cell's voltage from a particular side.

First a voltage measurement is made S903 across the cell connected in that position. Then, as seen in the flowchart the select for that position is enabled S904 and the open testing load is applied S905. These actions put a known open circuit test load on the cell position. The voltage is re-read S906 with load applied. The load is removed S907. The voltages are compared against predetermined rules for their proper relationship. If that test S908 for an open lead fails, the OPEN CIRCUIT routine shown in FIG. 12 is invoked called S913. If it passes, the STIM is enabled S910 and the voltage is re-read S911 and the STIM released S912. The "raw" and STIM enabled voltages are compared S914 to the predetermined criteria for that cell position in that module. If the STIM test is good, a program module called RECORD VOLTAGE is invoked S916 and then control returns. As long as there are un-read trusted cell positions in a module S917 and as long as there are un-examined trusted modules S918 this program module will loop through them until done S919. If a stim test is bad, a program module CAN'T MEASURE detailed in FIG. 13 is invoked S915.

Another case that will result in the OPEN CIRCUIT program module being invoked is a measured, unloaded cell value that is "implausible" for a correctly connected lead. For example a negative voltage or a positive voltage above the amount any single cell can achieve would also fail the impedance test criteria.

Record Voltage

This program module in the flowchart of FIG. 10, stores the raw value S1001, calculates, stores S1002 a filter voltage value in memory, and returns to the calling program module S1003.

System Integrity

This routine is invoked from the monitoring program modules upon any error detection. Seen in FIG. 11, it records the current error S1101. Then it evaluates S1102 the character and total number and types of errors and faults against predetermined criteria. Some criteria apply to a particular class of problems and others are more global.

The System Integrity program module concludes S1103, from this criteria comparison, either: Ok-normal operation S1104 or Critical issue S1105—cease operation safely in a timely manner.

Open Circuit

The open circuit program module of FIG. 12 first verifies the condition S1201. Then it marks S1202 the two adjacent cell-monitoring positions in the module as untrustworthy and marks S1203 the lead as open as seen from this side. After verifying and setting up for paired balancing S1204 the SYSTEM INTEGRITY program module is invoked S1205 Control is returned to the calling program S1206.

Can'T Measure

This program module seen in FIG. 13, first versifies S1201 the condition. Then it marks S1202 data values in the appropriate data tables to indicate that from this point in time all data regarding all cell measurements by the current module are untrustworthy. It also marks the module status table S1303 to indicate that the module is untrustworthy and sends commands to that module to attempt to place it in a quiescent state. The SYSTEM INTEGRITY program module is invoked S1304. Control is returned S1305 to the calling program.

Balance Check

This program module seen flowcharted in FIG. 14 is invoked periodically, but typically less often than the Measure and Test program module. It repeatedly S1401 looks through the "needs balancing" table and attempts to balance each cell that is balanceable. The SOC is reevaluated S1302 and compared S1403 to a trigger value. If the SOC is above the trigger value balancing is initiated. Balancing involves the steps of activating S1404 both the appropriate select line and the balance enable. In the present example that will dissipate charge, lowering the cells SOC to a desired level. While balancing, the cell's voltage is repeatedly measured S1405. This measurement might be with or without removal of balance load. In this state, the repeated voltage measurements are used to make two different decisions. If the voltage of the cell is appropriately changing, then balancing is proceeding. This allows updating the SOC estimate and therefore facilitates the decision as to whether to continue S1410 in the balancing loop or to decide the cell is balanced If balanced, it is checked S1408 to see if it is the last cell.

Moreover, in this example system the voltage is examined against an expected change due to the balancing. If this is not detected, the balance circuitry may have a fault in side-A or side-B, depending on which side is actively balancing (both could balance in parallel if desired). A branch can be taken S1406 indicating a balancing error. In a balancing error condition the SYSTEM INTEGRITY program module will be invoked S1407. Similarly, immediately after deactivating the balance enable, the voltage is watching for a short interval to detect if the balancing was indeed deactivated. Given that the failure detected side-A or side-B balance circuitry has now been isolated from further balancing influence, with the other side enabled. If both sides fail for a specific module, the System Integrity check will fail.

Paired Balance Check

This program module seen flowcharted in FIG. 15 is invoked periodically, but typically less often than the Measure and Test program module. Similarly to the normal balancing of the flowchart of FIG. 14, it repeatedly S1501 looks through the "paired balancing" table. The sum of the SOCs is reevaluated S1502 and compared S1503 to twice the normal trigger value. If the SOC is above that value, balancing is initiated S1504. Balancing involves the steps of activating both of the appropriate select lines and the balance enable. While balancing, the sum of the cells' voltage is repeatedly measured S1505. One test applied is whether or not the sum of the voltages is dropping as would be expected if the balancing drain were properly occurring. If not, a branch is taken S1506 as balancing error and the SYSTEM INTEGRITY routine is called S1507.

Otherwise, this allows updating the SOC estimate and therefore facilitates the decision as to whether to continue S1512 in the balancing loop. In this paired balancing case, the IV curve is examined as explained above and diagramed in FIGS. 8A, 8B, and 8C. An increased slope can indicated that one of the cells has hit a region of minimum SOC and further draining is halted. When the paired cells are balanced to the appropriate degree there is a check to see if this is the last cell S1510. If it is then this routine is done S1511

Central Controller

While FIG. 1 shows the logical connection of the CAN buses to the various modules with the BMS and outside the BMS, FIG. 16 shows an expanded view better illuminating the nature of the CAN bus configuration and the internal structure of the central controller of this example.

Within the central controller 140 seen expanded in FIG. 16 are two distinct microcomputers, each with CPU and RAM. The central controller has two redundant microprocessors uP #1 uP #2 with mutual cross checking to detect a failure in either. A protected isolated data communications path 610 provides for their intercommunication. Each also has a separate dedicated line 180A 180B for disabling the Pack power.

In the system of this first example the A-side CAN bus, while logically a single, broadcast bus is actually wired in a star configuration in the system as shown as seen in FIG. 9. Starting at the central controller 140, the A-side CAN bus 141 is made up of three distinct sets of conductors 141A 141B 141C, one connected point-to-point to each of the three subsystems. By transformer coupling and wire-ORing them together (or equivalent method of combing the signals) a single logical broadcast bus is maintained without additional electronic circuitry required. In the event that one subsystem attempts to erroneously transmits on its wires, this condition is minimized by the protected transmit enable and time out circuits local to the point of transmission on the modules Thus, further module-level protection from a fail-noisy CAN bus interface is provided by an interlocked enable signal 312 on the CAN bus transmitter 269B of each module.

Very similar to the protected enables of the balance and stim circuits; this enable would be protected by a CRC in the data field that is verified within the protected enable circuit block in an isolated fault domain. Also like the other protected enables, it has a time-out so the lack of a properly understood disable command does not prevent the transmitter from returning to a disabled state.

The transmitter enable feature can be used to support the robustness attribute of having each module's bus transmitter selectively enabled before the central controller addresses it. A "speak only when spoken to" protocol can be established that minimizes the case of one fail-noisy module bring down a whole subsystem. CAN Bus B 142 is also seen to be composed of three physical sets of conductors 142A 142B 142C analogous to the scheme of CAN bus A. Note that only uP #1 has direct access to the A CAN bus while only uP #2 has direct access to the B CAN bus, although direct dual-access is an alternative implementation. This dual redundant system is not intended to continue operation with one microcomputer failed. Under this case it is known to those skilled in the art to have two systems cooperating in accomplishing their common tasks while also cross checking each other. CAN bus C is shown controller by uP #1 and monitored by uP #2 for cross-checking purposes. If the Control Module were resident in the pack, the redundancy would be required to increase from dual to triplex in order to be fully fail-operational.

Alternatives and Variations Around the First Example Embodiment

As will be known to those skilled in the art there are many possible variations on this first example system that are possible and possibly suited to particular applications and design goals. Only a few of those variations are presented below.

Stim

The example above uses a set of fixed-ratio voltage dividers (of diverse ratios) to provide a know "stimulus" to the voltage measuring inputs. Other stim schemes could add a fixed, known DC voltage and still other approaches might superimpose an AC signal or other unique stim methodology. Preferably the effect is distinct for each cell. Isolation may include following effectively conservative design rules and might include opto- or transformer couplings. Preferably the stimulus effect is unique and unambiguous in each of its applications.

Bus

The "A" serial bus and "B" serial bus can be composed of single or multiple individual physical buses. For example, separate wiring might be associated with each module as in the first example system or there may be an electrically common physical media. The CAN bus interfaces might be optically isolated rather than transformer coupled. Buses other than CAN might be used and separate logical buses might be used to communicate between the central controller and each module. Some versions of systems might use bus interconnects that are point-to-point. Others might employ those that are daisy chained while still others will be common media buses.

One alternative is to use a bus native to the BMS IC, such as SPI or I squared C, for intercommunication between modules within a subsystem. In that case, a CAN bus interface could be located at the subsystem level that provided a more robust bus out to the Central Controller.

Rather than combining the received signals at the Controller from multiple sources each source individually enabled as in the example system, an alternate scheme might be used. In the alternate scheme the O-Ring together of multiple physical media might be conditional under the control of the central controller. Thus the Controller might physically select the source of interest, ignoring all others or conversely, de-select an offending physical media path.

Protected Enable

The protected enable activation might be accomplished by commands encoded with a Hamming code or other coding that provides protection from noise or other bus anomaly being interpreted as an enable activation command.

Hardware Implementation

Rather than off the shelf BMS ICs, application specific integrated circuits (ASIC), custom system-on-a-chip (SoC), or discrete components can be used; not to be confused with state-of-charge (SOC). Various physical partitioning of functions can be used in other embodiments. The hierarchy of subsystem and module might be replaced with a "flat" implementation or with a version with a greater number of hierarchical levels. In some systems strings of cells may be selectively electrically connected and disconnected from the battery. A system might have multiple packs or other packaging configurations. In this example there is no "intelligence" at the module level. It is well known to those skilled in the art to make hardware/firmware/software tradeoffs appropriate to the goals and needs of a specific application or version. Some variations might have a degree of local processing while still being consistent with the teachings herein.

Balancing

While the example system uses charge draining to balance cells (dissipative) other versions can use or charge-transfer (non-dissipative) balancing techniques that are isolated, enabled and selected in an analogous manner to that used in the example system. The fundamental taught herein regarding balancing, is that of fully independent and fault-tolerance enabling for redundant balancing capability for the same cells, such that a failed balance circuit can be locked-out of further balancing effect and another non-faulted balance circuit can be utilized.

Second Example System—Distributed Control

In this second example embodiment, the function of the central controller is distributed. Each module has a microprocessor that executes the program modules of the first example, but only for a single module. Additional program modules are used to coordinate overall system information and decision-making across the multiple distributed controllers. Methods of distributed control generally are well known to those skilled in the art.

In order to increase the number of independent fault domains of logic involved in the operation of each module, the microprocessor on a given module in this second example is tasked with controlling the measurement, balancing and other BMS functions of an adjacent module within the same subsystem rather than controlling the BMS logic on the physical module it resides upon. See FIG. 17 for a representation of this distributed control approach example.

Alternative Aspects Regarding Second Example System

Alternate versions with the program module logic embodied in a distributed manner could be of a similar block diagram to FIG. 17 but with each microcomputer executing the program modules to monitor and balance the cells connected to its physical module rather than each being responsible for its adjacent module's functioning. A third approach would be to have the distribution of control at the subsystem level, or other similar sub-levels.

Another distributed version would be to have microcomputers within each subsystem, but outside of any module. Again, this partitioning might be used in a way that each microcomputer executes program modules to monitor the hardware modules on the same subsystem where it resides. Alternatively, it might be responsible for the modules on an adjacent subsystem.

The various illustrative program modules and steps described in connection with the embodiments disclosed herein may be implemented as electronic hardware, computer software, or combinations of both. The various illustrative program modules and steps have been described generally in terms of their functionality. Whether the functionality is implemented as hardware or software depends in part upon the hardware constraints imposed on the system. Hardware and software may be interchangeable depending on such constraints. As examples, the various illustrative program modules and steps described in connection with the embodiments disclosed herein may be implemented or performed with an application specific integrated circuit (ASIC), a field programmable gate array (FPGA) or other programmable logic device, discrete gate or transistor logic, discrete hardware components, a conventional programmable software module and a processor, or any combination thereof designed to perform the functions described herein. The processor may be a microprocessor, CPU, controller, microcontroller, programmable logic device, array of logic elements, or state machine. The software module may reside in RAM memory, flash memory, ROM memory, EPROM memory, EEPROM memory, a hard disk, a removable disk, a CD, DVD or any other form of storage medium known in the art. An exemplary processor may be coupled to the storage medium to read information from, and write information to, the storage medium. In the alternative, the storage medium may be integral to the processor.

In further embodiments, those skilled in the art will appreciate that the foregoing methods can be implemented by the execution of a program embodied on a computer readable medium. The medium may comprise, for example, RAM accessible by, or residing within the device. Whether contained in RAM, a diskette, or other secondary storage media, the program modules may be stored on a variety of machine-readable data storage media, such as a conventional "hard drive", magnetic tape, electronic read-only memory (e.g., ROM or EEPROM), flash memory, an optical storage device (e.g., CD, DVD, digital optical tape), or other suitable data storage media.

This description, figures and examples are intended to be non-limiting and to teach the principles and use of the invention. The claims below, in contrast, set out its metes and bounds. In the claims, the words "a" and "an" are to be taken to mean "at least one" even if some claim wording explicitly calls for "at least one" or "one or more".

It is claimed:

1. A battery management system for a plurality of interconnected cells wherein cells are monitorable and balanceable independently by at least two sides of redundant circuitry, the two circuitry sides respectively constituted in distinct fault domains; each side of circuitry being comprised of at least two mutually fault-isolated subsections, each subsection providing for the monitoring and balancing of at least two cells; further, portions of the circuitry of a subsection of a first side, which, when activated, interfere with the ability of the opposite side's circuitry to manage and balance a common cell, require at least two independent enables to activate; still further, each of the at least two subsections of each of the at least two sides comprises test circuitry for subsection fault detection.

2. The battery management system of claim 1 wherein subsections are disable-able upon detection of a subsection fault.

3. The s battery management system of claim 1 additionally comprising control logic in communication with the at least two subsections of the at least two sides, the communication paths between the control logic and each side being mutually independent.

4. The battery management system of claim 1 further requiring receipt of an encoded message by the subsection circuitry in order to activate at least one of the independent enables.

5. A battery management module with at least two channels each for monitoring and balancing a cell, each channel comprising an input stimulation circuit and a cell balancing circuit; the cell balancing circuit requiring at least two independent enables to be activated; further, the stimulation circuits, when activated, applying a mutually unique, measurement-altering condition to each of the at least two channels.

6. The battery management module of claim 5 wherein the applied measurement-altering condition alters the measured cell voltages in mutually distinct manners.

7. The battery management module of claim 6 wherein the stimulation circuit, when activated, is such as to alter the measured cell voltages of at least two cells, respectively, in mutually distinct degrees according to predetermined rules imposed by the values of passive components.

8. The battery management module of claim 7 wherein the altering of measured cell voltages is a DC voltage effect.

9. A fault tolerant battery management system comprising: a first set of electronic circuits and a second set of electronic circuits; each set for redundantly monitoring and managing a common plurality of interconnected battery cells; a controller for commanding and for collecting data from the first and second set of electronic circuits; the first set of electronic circuits constituted in slices of circuitry, each slice associated with and responsible for monitoring and managing one or more cells; further, any mode of the first set of electronic circuits that can interfere with the second set of electronic circuits' monitoring and management of commonly connected cells requires at least two independent enables to be activated, at least one of the enables further requiring a coded message from the controller for activation; further, the controller, having notice of a failure in a slice of circuitry will effectively isolate that slice from interfering with its associated at least one cell.

10. The battery management system of claim 9 wherein the second set of electronics is constituted in independent slices of circuitry; each respective slice requiring at least two independent enables to activate any mode that would interfere with the first set of electronics' ability to monitor and manage any common cells.

11. The battery management system of claim 9 wherein independent means constituted in distinct fault domains.

12. The battery management system of claim 9 further including the plurality of interconnected cells.

13. The battery management system of claim 9 wherein the controller commands the first and second sets of electronics over at least two redundant serial buses.

14. A method for balancing two series connected, adjacent cells of a battery as a pair comprising:
   a) determining the two cells' respective individual balancing histories;
   b) allowing paired balancing if the respective balancing histories' mutual agreement is within a first predetermined criterion;
   c) taking a first predetermined action if the respective balancing histories' degree of mutual agreement is outside of the first predetermined criteria.

15. The method of paired balancing of two cells of claim 14 further comprising:
   a) initiating charge extraction from the pair when their paired-voltage reaches a point effectively indicative of two times the value of one cell fully charged;
   b) detecting, while charging, a deviation in the paired-voltage's slope from that of a plurality of cells being charged in a common battery; the deviation in slope being indicative of at least one of the paired cells entering overcharging; and recording the voltage level at this first type of event;
   c) detecting, while discharging, a deviation in the paired-voltage's slope from that of cells being charged in a common battery; the deviation of slope being indicative of at least one of the paired cells entering over-discharging; and recording the voltage level at this second type of event;
   d) comparing one or more voltages recorded at a first type of event to one or more voltages recorded at a second type of event; if the difference in voltages at which overcharging tends to occur are as to the voltages at which over-discharging differ less than an amount set by a predetermined rule, take a predetermined action.

16. The method of paired balancing of claim 15 wherein the slope of voltage of a plurality of voltages in a battery is the total pack voltage.

17. The method of paired balancing of two series adjacent cells of claim 15 wherein the predetermined action of step (d) includes future charging and discharging in a limited manner, effectively reducing battery capacity.

18. The method of paired balancing of two series adjacent cells of claim 14 wherein the first predetermined action of step (c) comprises: allowing paired balancing if the respective balancing histories mutual agreement is within a more liberal second, predetermined criteria, with a balancing upper voltage trigger value that is minus a de-rating factor; the de-rating factor being a function of the degree of difference in the balancing histories such that greater difference in balancing histories engendering greater de-rating amounts.

19. A battery charging apparatus comprising:
a) an electrical connection for a battery cell;
b) a charge transfer circuit operationally coupled to the electrical connection, the circuit for transferring charge from, or optionally into, a connected cell;
c) a mutually distinct first and second control logic circuit each having a respective enable signal as an output, both enable signals operatively coupled to said charge transfer circuit; the coupling of the enable signals to said charge transfer circuit such that activation of charge transfer requires both enable signals to contemporaneously be in activated states;
further, the first and second control logic circuits being substantially constituted in mutually distinct fault domains.

20. The battery charging apparatus of claim 19 wherein the enable signal of the first control logic is transitioned to a state engendering activation via a coded message receivable by the first control logic circuit.

21. The battery charging apparatus of claim 20 wherein the coded message is received over a serial bus interface.

22. The battery charging apparatus of claim 19 wherein at least a portion of the charge transferring circuit acts as a switch and is gated by at least one enable signal is comprised of electronic components that are fault-isolated from the electrical connection.

23. A battery monitor apparatus for connecting to at least two cells comprising:

a) at least one analog-to-digital converter having effectively at least two analog inputs;
b) a stimulus circuit for applying known test conditions to the analog inputs;
c) a first control circuit operatively coupled to said stimulus circuit, the control circuit constituted and arranged as to selectively enable application of the known test condition to the analog inputs;
further, at least a portion of said stimulus circuit being comprised of electronic components situated in a fault domain other than that of the analog-to-digital converter; further,
the stimulus circuit so configured as to provide a distinct stimulus to a first of the of the at least two analog inputs as compared to the stimulus provided to a distinct second of the at least two analog inputs; still further,
when connected to the at least two cells, the imposition of a stimulus on the inputs has no significant hindering effect on any concurrent monitoring and managing of the connected cells by a second, duplicate redundant battery monitor and management apparatus, or optionally has provisions for fail-safe isolation to achieve non-interference.

24. The battery monitor apparatus of claim 23 wherein said stimulus circuit comprises a voltage divider.

25. The battery monitor apparatus of claim 23 wherein said stimulus circuit, when activated provides a test condition that results in a DC voltage effect.

26. The battery monitor apparatus of claim 23 wherein said stimulus circuit, when activated provides a test condition that results in an AC voltage effect.

27. The battery monitor apparatus of claim 23 wherein said test condition's degree of effect on said analog inputs is predetermined by the value of passive components.

28. The battery monitor apparatus of claim 23 wherein the test condition imposable on a first analog input of the at least two analog inputs is the summing of a known voltage.

29. The battery monitor apparatus of claim 23 wherein the characteristic of the test condition imposable on a first analog input of the at least two analog inputs is substantially the same as the characteristic of the test condition imposable on a second analog input of the at least two analog inputs and the two test conditions differing in degree only.

* * * * *